(12) United States Patent
West et al.

(10) Patent No.: US 9,768,245 B2
(45) Date of Patent: Sep. 19, 2017

(54) HIGH BREAKDOWN VOLTAGE MICROELECTRONIC DEVICE ISOLATION STRUCTURE WITH IMPROVED RELIABILITY

(71) Applicant: Texas Instruments Incorporated, Dallas, TX (US)

(72) Inventors: Jeffrey Alan West, Dallas, TX (US); Thomas D. Bonifield, Dallas, TX (US); Byron Lovell Williams, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/045,449

(22) Filed: Feb. 17, 2016

(65) Prior Publication Data

US 2016/0163785 A1    Jun. 9, 2016

Related U.S. Application Data

(63) Continuation of application No. 14/277,851, filed on May 15, 2014, now Pat. No. 9,299,697.

(51) Int. Cl.
| | |
|---|---|
| *H01L 49/02* | (2006.01) |
| *H01L 21/02* | (2006.01) |
| *H01L 29/78* | (2006.01) |
| *H01L 27/06* | (2006.01) |
| *H01L 21/8234* | (2006.01) |

(Continued)

(52) U.S. Cl.
CPC .......... *H01L 28/91* (2013.01); *H01L 21/0214* (2013.01); *H01L 21/0217* (2013.01); *H01L 21/02164* (2013.01); *H01L 21/823481* (2013.01); *H01L 27/0629* (2013.01); *H01L 28/40* (2013.01); *H01L 28/60* (2013.01);
(Continued)

(58) Field of Classification Search
CPC .................................................... H01L 27/108
See application file for complete search history.

(56) References Cited

U.S. PATENT DOCUMENTS 5,618,749 A * 4/1997 Takahashi ........... H01L 27/0629
148/DIG. 136
5,814,875 A * 9/1998 Kumazaki ............. H01L 21/765
257/488

(Continued)

*Primary Examiner* — Caridad Everhart
*Assistant Examiner* — Ankush Singal
(74) *Attorney, Agent, or Firm* — Tuenlap D. Chan; Charles A. Brill; Frank D. Cimino

(57) ABSTRACT

A microelectronic device contains a high voltage component having a high voltage node and a low voltage node. The high voltage node is isolated from the low voltage node by a main dielectric between the high voltage node and low voltage elements at a surface of the substrate of the microelectronic device. A lower-bandgap dielectric layer is disposed between the high voltage node and the main dielectric. The lower-bandgap dielectric layer contains at least one sub-layer with a bandgap energy less than a bandgap energy of the main dielectric. The lower-bandgap dielectric layer extends beyond the high voltage node continuously around the high voltage node. The lower-bandgap dielectric layer has an isolation break surrounding the high voltage node at a distance of at least twice the thickness of the lower-bandgap dielectric layer from the high voltage node.

20 Claims, 25 Drawing Sheets

(51) Int. Cl.
*H01L 29/06* (2006.01)
*H01L 29/66* (2006.01)

(52) U.S. Cl.
CPC .... *H01L 29/0692* (2013.01); *H01L 29/66477* (2013.01); *H01L 29/78* (2013.01); *H01L 29/7833* (2013.01)

(56) References Cited

U.S. PATENT DOCUMENTS

| | | | |
|---|---|---|---|
| 6,441,419 B1 | 8/2002 | Johnson | |
| 8,101,477 B1* | 1/2012 | Power | H01L 27/11521 257/314 |
| 8,405,189 B1 | 3/2013 | Ward | |
| 8,890,223 B1 | 11/2014 | Bonifield | |
| 9,087,853 B2 | 7/2015 | Tao | |
| 2005/0215022 A1 | 9/2005 | Adam | |
| 2006/0077713 A1* | 4/2006 | Ito | G11C 16/0466 365/185.18 |
| 2006/0145251 A1 | 7/2006 | Ko | |
| 2006/0189089 A1 | 8/2006 | Larkin | |
| 2007/0296085 A1 | 12/2007 | Coolbaugh | |
| 2009/0095995 A1* | 4/2009 | Kawashima | H01L 27/0629 257/296 |
| 2009/0108323 A1* | 4/2009 | Jee | H01L 21/76224 257/315 |
| 2010/0032741 A1 | 2/2010 | Ueno | |
| 2011/0244666 A1* | 10/2011 | Kim | H01L 27/11551 438/478 |
| 2012/0146124 A1 | 6/2012 | Hafez | |
| 2012/0205251 A1 | 8/2012 | Kalkan | |
| 2012/0211868 A1 | 8/2012 | Stribley | |
| 2013/0001738 A1 | 1/2013 | Dong | |
| 2014/0145297 A1 | 5/2014 | Daamen | |
| 2014/0145301 A1 | 5/2014 | Moghe | |
| 2014/0252551 A1 | 9/2014 | Dix | |
| 2014/0253227 A1 | 9/2014 | Yach | |
| 2014/0264740 A1 | 9/2014 | Stribley | |
| 2015/0115407 A1 | 4/2015 | Tao | |
| 2015/0187781 A1* | 7/2015 | Hong | H01L 27/11521 257/316 |
| 2015/0200307 A1* | 7/2015 | Matsuo | H01L 29/7926 257/326 |
| 2015/0214292 A1 | 7/2015 | Tao | |
| 2015/0294726 A1* | 10/2015 | Sim | G11C 16/10 365/185.12 |

* cited by examiner

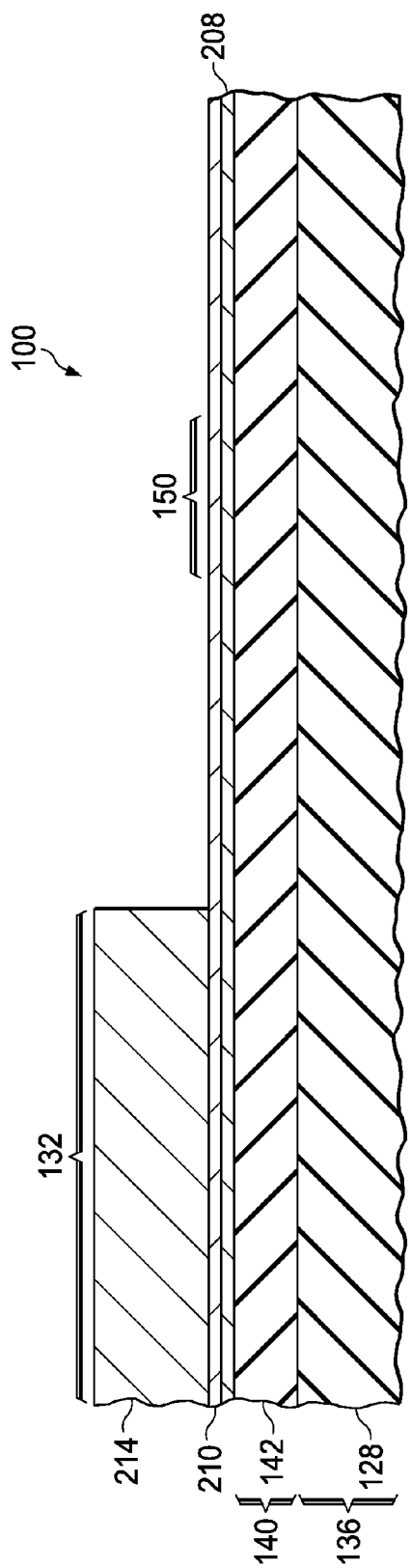
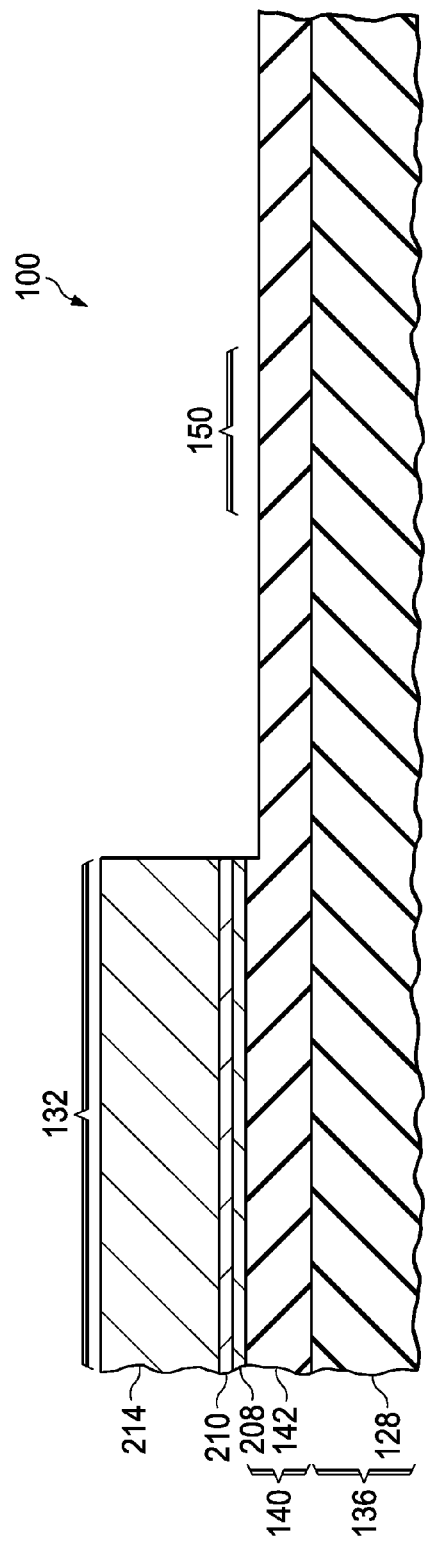

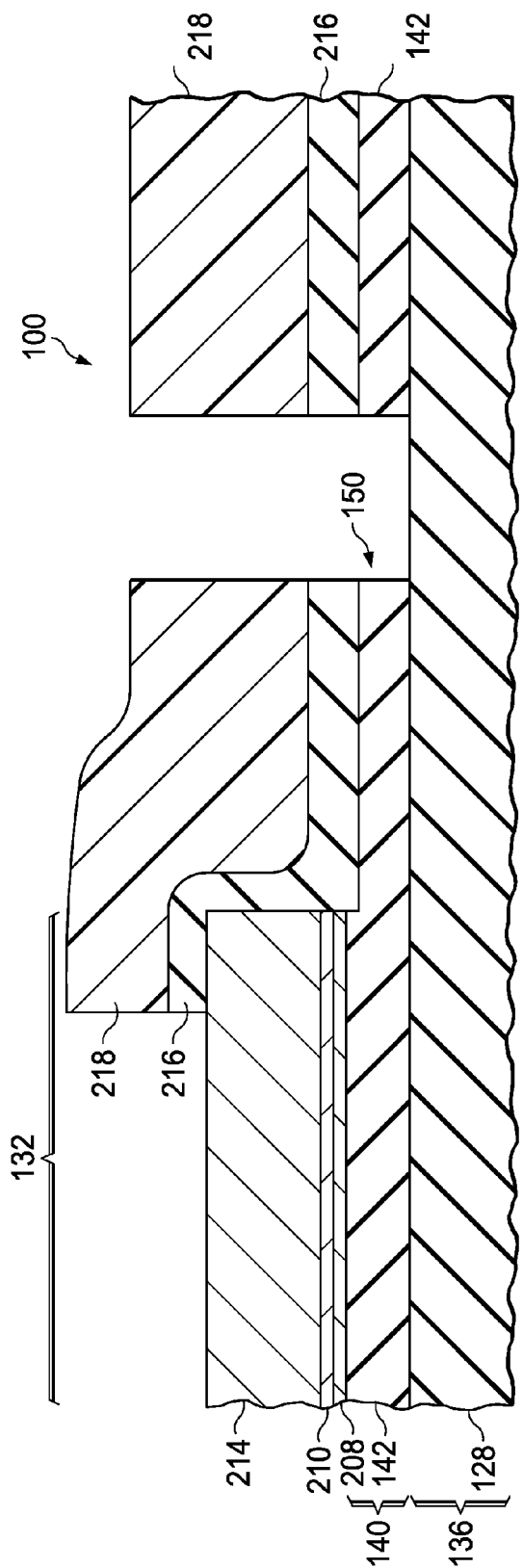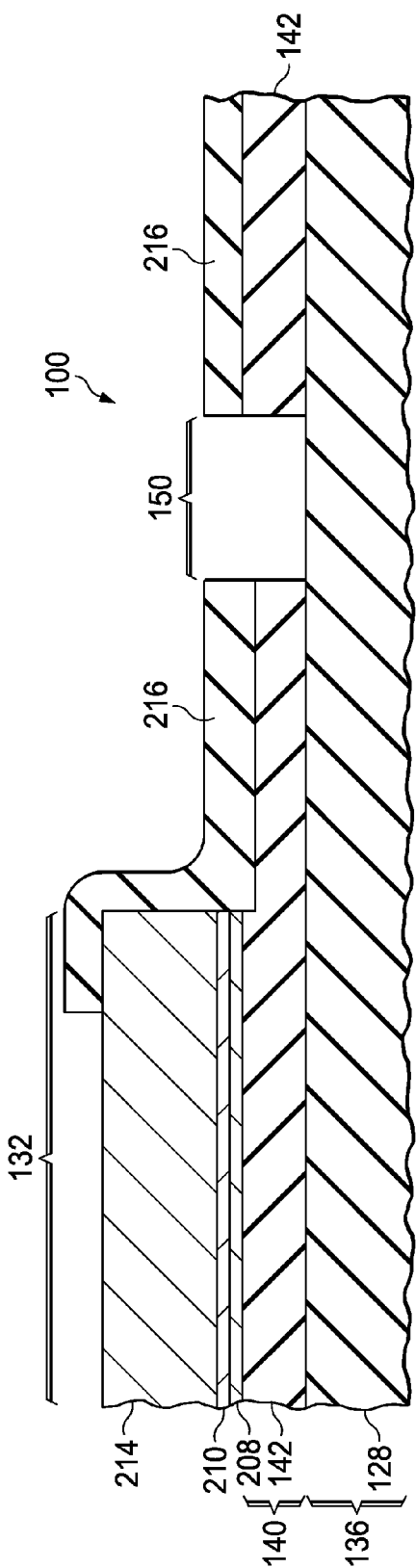

HIGH BREAKDOWN VOLTAGE MICROELECTRONIC DEVICE ISOLATION STRUCTURE WITH IMPROVED RELIABILITY

CROSS-REFERENCE TO RELATED APPLICATIONS

Under 35 U.S.C. §§120, this continuation application claims priority to and benefits of U.S. patent application Ser. No. 14/277,851 (TI-73905), filed on May 15, 2014, the entirety of which is incorporated herein by reference.

FIELD

This disclosure relates to the field of microelectronic devices. More particularly, this disclosure relates to high voltage components in microelectronic devices.

BACKGROUND

A microelectronic device with a high voltage component having a high voltage node, operable at a potential greater than 100 volts, may have a thin lower-bandgap dielectric layer between the high voltage node and a main dielectric which is several microns thick separating the high voltage node from low voltage components. The lower-bandgap dielectric layer, with a thickness commonly less than 10 percent of the thickness of the main dielectric, has a bandgap energy less than the main dielectric, and provides reliability for the main dielectric by reducing peak electric fields at corners of the high voltage node. However, the lower-bandgap dielectric layer supports other reliability degradation mechanisms which undesirably limit overall reliability of the microelectronic device.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A microelectronic device contains a high voltage component having a high voltage node and a low voltage node. The high voltage node is isolated from the low voltage node by a main dielectric between the high voltage node and low voltage elements formed at a surface of a substrate of the microelectronic device. A lower-bandgap dielectric layer is disposed between the high voltage node and the main dielectric. The lower-bandgap dielectric layer contains at least one sub-layer with a bandgap energy less than a bandgap energy of the main dielectric. The lower-bandgap dielectric layer extends beyond the high voltage node continuously around the high voltage node. The lower-bandgap dielectric layer has an isolation break surrounding the high voltage node at a distance of at least twice the thickness of the lower-bandgap dielectric layer from the high voltage node.

DESCRIPTION OF THE VIEWS OF THE DRAWING

FIG. 6A through FIG. 6G are cross sections of the microelectronic device of FIG. 1 at the isolation break, depicting a further alternate method of forming the isolation break and high voltage node.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device contains a high voltage component having a high voltage node and a low voltage node. The high voltage node is isolated from the low voltage node by a main dielectric between the high voltage node and low voltage elements formed at a surface of a substrate of the microelectronic device. A lower-bandgap dielectric layer is disposed between the high voltage node and the main dielectric. The lower-bandgap dielectric layer contains at least one sub-layer with a bandgap energy less than a bandgap energy of the main dielectric. The lower-bandgap dielectric layer extends beyond the high voltage node continuously around the high voltage node. The lower-bandgap dielectric layer has an isolation break surrounding the high voltage node at a distance of at least twice the thickness of the lower-bandgap dielectric layer from the high voltage node. The isolation break is located between the high voltage node and low voltage elements of the microelectronic device.

Figure 1:
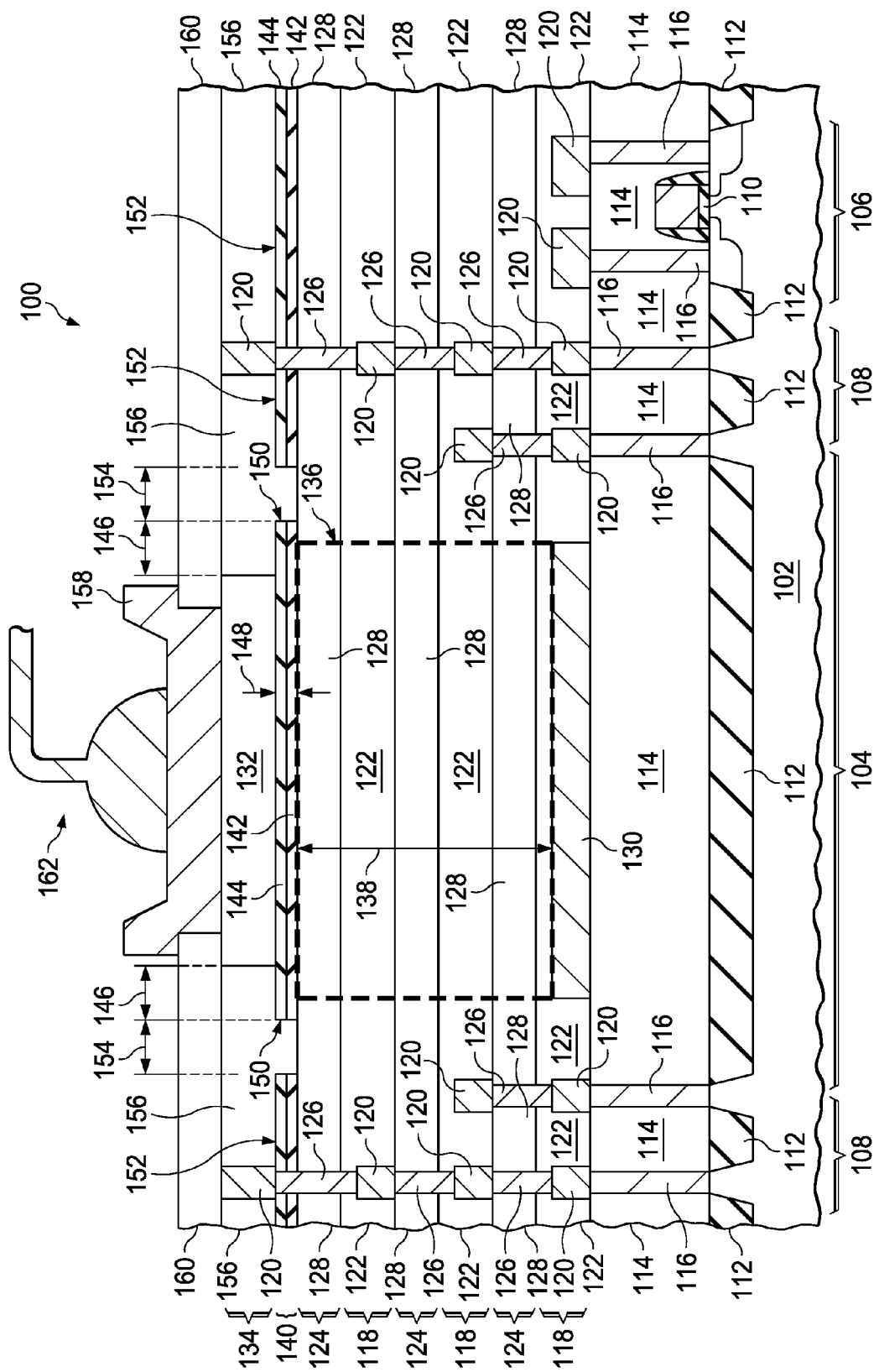
FIG. 1 is a cross section of an example microelectronic device containing a high voltage component.

FIG. 1 is a cross section of an example microelectronic device containing a high voltage component. In the instant example, the microelectronic device 100 is described as an integrated circuit 100. Other configurations for the microelectronic device 100 such as a standalone component or a hybrid circuit, are within the scope of the instant example. The microelectronic device 100 is formed on a substrate 102 such as a silicon wafer. The microelectronic device 100 includes the high voltage component 104, depicted in FIG.

1 as a high voltage capacitor 104, and possibly a low voltage component 106 which operates at 24 volts or less, depicted as a metal oxide semiconductor (MOS) transistor 106 with a gate dielectric layer 110 less than 70 nanometers thick. The microelectronic device 100 may optionally include a faraday cage 108 around the high voltage component 104.

Field oxide 112 may be formed in the substrate 102 to laterally isolate elements of the microelectronic device 100. A pre-metal dielectric (PMD) layer 114 is formed over the substrate 102. Contacts 116 are disposed through the PMD layer 114 to provide electrical connections for the low voltage component 106 and the faraday cage 108.

A plurality of metal levels 118 are disposed over the PMD layer 114. The metal levels 118 include metal interconnects 120 connected to the low voltage component 106 and the faraday cage 108. Intra-metal dielectric (IMD) layers 122 of silicon dioxide-based dielectric material are disposed between the metal interconnects 120 in each metal level 118. Via levels 124 are disposed between the metal levels 118. The via levels 124 include metal vias 126 connecting the metal interconnects 120. The metal vias 126 are disposed through inter-level dielectric (ILD) layers 128 of silicon dioxide-based dielectric material in each via level 124. Other dielectric materials for the IMD layers 122 and the ILD layers 128, such as low-k materials, are within the scope of the instant example. The IMD layers 122 and the ILD layers 128 may possibly include cap layers and etch stop layers of different dielectric materials, such as silicon nitride. The IMD layers 122 may be parts of the corresponding ILD layers 128, depending on the process sequence used to form the plurality of metal levels 118.

A low voltage node 130 of the high voltage component 104, depicted as a lower plate 130 of the high voltage capacitor 104, is disposed in one of the metal levels 118, for example a first metal level 118 as depicted in FIG. 1. A high voltage node 132 of the high voltage component 104, depicted as an upper plate 132 of the high voltage capacitor 104, is disposed in another metal level 134, for example a top metal level 134 as depicted in FIG. 1. The combined IMD layers 122 and ILD layers 128 between the low voltage node 130 and the high voltage node 132 provide a main dielectric 136 of the high voltage component 104. In the instant example, the main dielectric 136 is a capacitor dielectric 136 of the high voltage capacitor 104. A thickness 138 of the capacitor dielectric 136 is at least 2 microns and may be determined by a desired operating voltage of the upper plate 132 relative to the lower plate 130 and possibly the substrate 102. For example, a version of the high voltage capacitor 104 in which the upper plate 132 is designed to operate at 1000 volts may have a capacitor dielectric 136 with a thickness 138 of 16 microns to 20 microns.

A lower-bandgap dielectric layer 140 is disposed between the main dielectric 136 and the high voltage node 132, opposite from the low voltage node 130. The lower-bandgap dielectric layer 140 includes at least one dielectric sub-layer with a bandgap energy less than a bandgap energy of a portion of the main dielectric 136 adjacent to the high voltage node 132. In the instant example, the lower-bandgap dielectric layer 140 includes a first sub-layer 142 of silicon oxide nitride, 200 nanometers to 600 nanometers thick, contacting the main dielectric 136, and a second sub-layer 144 of silicon nitride, 200 nanometers to 600 nanometers thick, between the first sub-layer 142 and the high voltage node 132, contacting both. The first sub-layer 142 of silicon oxide nitride has a lower bandgap energy than the silicon dioxide-base dielectric material of the main dielectric 136, and the second sub-layer 144 of silicon nitride has a lower bandgap energy than the first sub-layer 142. The lower-bandgap dielectric layer 140 extends past the high voltage node 132, continuously around the high voltage node 132, by a distance 146 which is at least twice a thickness 148 of the lower-bandgap dielectric layer 140. There is an isolation break 150 in the lower-bandgap dielectric layer 140 contacting the high voltage node 132; the isolation break 150 surrounds the high voltage node 132. The isolation break 150 is located no closer to the high voltage node 132 than the distance 146. An optional low voltage portion 152 of the lower-bandgap dielectric layer 140 may be disposed external to the isolation break 150 so that the low voltage portion 152 of the lower-bandgap dielectric layer 140 is separated from the lower-bandgap dielectric layer 140 contacting the high voltage node 132 by the isolation break 150. The low voltage portion 152 of the lower-bandgap dielectric layer 140 may contact low voltage elements of the microelectronic device 100 which extend up to the lower-bandgap dielectric layer 140, such as the faraday cage 108. The isolation break 150 is located between the high voltage node 132 and any low voltage element of the microelectronic device 100, so that the lower-bandgap dielectric layer 140 contacting the high voltage node 132 does not contact any low voltage element. The isolation break 150 advantageously prevents leakage current through an interface of the lower-bandgap dielectric layer 140 from the high voltage node 132 to a low voltage element of the microelectronic device 100. The low voltage portion 152 of the lower-bandgap dielectric layer 140, if present, is laterally separated from the lower-bandgap dielectric layer 140 contacting the high voltage node 132 by an isolation distance 154 which is at least 1 micron, and may be 10 microns to 25 microns to advantageously provide process margin in a lithographic process for forming the isolation break 150. Forming the lower-bandgap dielectric layer 140 with the isolation break 150 is particularly advantageous for instances of the high voltage component 104 which operate at 1000 volts or higher, as such a component without the lower-bandgap dielectric layer 140 with the isolation break 150 would have such low reliability as to preclude a useful embodiment of the microelectronic device 100.

The high voltage node 132 is disposed in an upper IMD layer 156, which covers edges of the lower-bandgap dielectric layer 140 at the isolation break 150. The upper IMD layer 156 may include silicon dioxide, similarly to the main dielectric 136.

The high voltage node 132 may be connected to, or may be part of, a bondpad 158 of the microelectronic device 100, as depicted in FIG. 1. A protective overcoat 160 of polyimide, silicon nitride, silicon oxide nitride and/or silicon dioxide may be disposed over the high voltage node 132 or may overlap edges of the high voltage node 132 as depicted in FIG. 1. An electrical connection 162 to the high voltage node 132 may be made through a wirebond 162. The low voltage portion 152 of the lower-bandgap dielectric layer 140 may advantageously shield the low voltage components 106 from electric fields from the electrical connection 162 to the high voltage node 132.

During operation of the microelectronic device 100, when a high voltage is applied to the high voltage node 132 and a low voltage is applied to the low voltage node 130, the lower-bandgap dielectric layer advantageously provides reliability for the main dielectric 136 by reducing an electric field at corners of the high voltage node 132. The isolation break 150 advantageously provides reliability by preventing leakage current through the lower-bandgap dielectric layer 140 from the high voltage node 132 to a low voltage element of the microelectronic device 100.

Figure 2A:
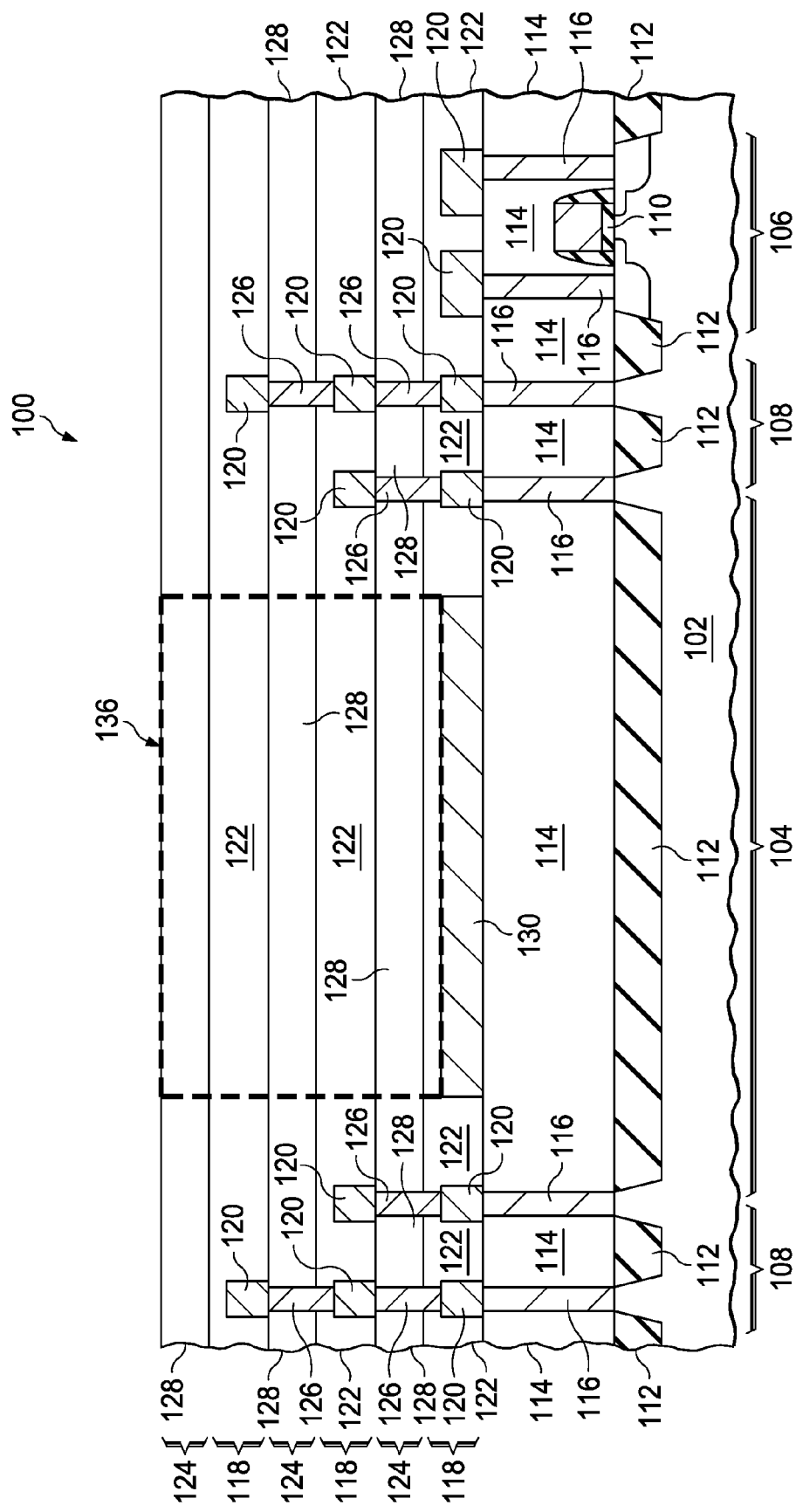
FIG. 2A through FIG. 2F are cross sections of the microelectronic device of FIG. 1, depicted in successive stages of fabrication.

FIG. 2A through FIG. 2F are cross sections of the microelectronic device of FIG. 1, depicted in successive stages of fabrication. Referring to FIG. 2A, the microelectronic device 100 is formed on the substrate 102, which may be a silicon wafer or other semiconductor substrate, or may be a dielectric substrate such as sapphire or aluminum oxide ceramic. In versions of the instant example in which the substrate 102 is a semiconductor substrate, the field oxide 112 may be formed to laterally isolate elements of the microelectronic device 100 in the substrate 102. The field oxide 112 may be formed by a shallow trench isolation (STI) process, a local oxidation of silicon (LOCOS) process or other method.

The low voltage component 106 is formed in and on the substrate 102. The low voltage component 106 may be proximate to the high voltage component 104, and may be separated from the high voltage component 104 by the faraday cage 108.

The PMD layer 114 is formed over the substrate 102. The PMD layer 114 may include a dielectric layer stack including a silicon nitride or silicon dioxide PMD liner 10 to 100 nanometers thick formed by a plasma enhanced chemical vapor deposition (PECVD) process, a layer of silicon dioxide, phosphorus silicate glass (PSG) or boron phosphorus silicate glass (BPSG) formed by a PECVD process, commonly 100 to 1000 nanometers thick, commonly leveled by a chemical-mechanical polish (CMP) process, and an optional PMD cap layer, commonly 10 to 100 nanometers of a hard material such as silicon nitride, silicon carbide nitride or silicon carbide formed by another PECVD process. Contact holes are formed through the PMD layer 114 to expose the substrate 102, for example in the low voltage component 106 and the faraday cage 108 and possibly in the high voltage component 104. The contacts 116 are formed in the contacts holes to provide electrical connections. The contacts 116 may be formed by forming a liner of titanium and titanium nitride using a sputter process and an atomic layer deposition (ALD) process respectively, forming a tungsten layer on the liner using a metal organic chemical vapor deposition (MOCVD) process to fill the contact holes, and removing the tungsten and liner from a top surface of the PMD layer 114 using an etchback and/or a CMP process.

The metal levels 118 and IMD layers 122, and the via levels 124 and the ILD layers 128, may be formed by any of several methods. In one version of the instant example, any of the metal levels 118 may be formed by forming an aluminum-based interconnect metal layer over the underlying PMD layer 114 or ILD layer 128. The aluminum-based interconnect metal layer may include an adhesion layer of titanium, titanium tungsten or titanium nitride, an aluminum layer containing a few percent silicon, titanium and/or copper, 200 nanometers to several microns thick, on the adhesion layer, and possibly an anti-reflection layer of titanium or titanium nitride on the aluminum layer. An interconnect etch mask including photoresist is formed over the interconnect metal layer covering areas for the metal interconnects 120, and an etch process such as a plasma etch using chlorine radicals is used to remove the interconnect metal layer in areas exposed by the interconnect etch mask, leaving the metal interconnects 120. The corresponding IMD layer 122 is subsequently-formed between the metal interconnects 120. The IMD layer 122 may be formed by depositing a layer of silicon dioxide-based dielectric material by a PECVD process using tetraethyl orthosilicate, also known as tetraethoxysilane (TEOS), and subsequently planarizing the dielectric material by a resist etchback process or a CMP process, so that the IMD layer 122 covers metal interconnects 120 as shown in FIG. 1. The IMD layer 122 may possibly include silicon dioxide-based dielectric material formed by spin coating the microelectronic device 100 with a solution containing methylsilsesquioxane (MSQ) and subsequently baking the solution to remove volatile material.

In another version of the instant example, any of the metal levels 118 may be formed by a single damascene process in which the IMD layer 122 is formed first, and interconnect trenches are formed through the IMD layer 122 in areas for the metal interconnects 120. The IMD layer 122 may be a stack of dielectric layers including an etch stop layer, a main layer and a cap layer, formed by sequential PECVD processes. A liner of tantalum nitride is formed by an ALD process over the IMD layer 122, extending into the interconnect trenches as a conformal liner. A seed layer of sputtered copper is formed on the liner and electroplated copper is formed on the seed layer to fill the interconnect trenches. A copper CMP process removes the copper and liner from a top surface of the IMD layer 122, leaving the metal interconnects 120 in the interconnect trenches.

In a further version, the metal interconnects 120 may be formed by a liftoff process, in which a liftoff pattern of organic material such as photoresist is formed over the corresponding lower ILD layer 128 which has openings for the metal interconnects 120. Metal layers for the metal interconnects 120 are deposited over the liftoff pattern and onto the ILD layer 128 in the openings. The liftoff pattern is subsequently removed using a solvent spray, taking the metals layers on the liftoff pattern, leaving the metal interconnects 120.

In one version of the instant example, any of the via levels 124, including the corresponding vias 126 and ILD layer 128 may be formed by a similar process as described for the contacts 116. In another version, the via levels 124, including the corresponding vias 126 and ILD layer 128 may be formed by a single damascene process as described for the metal levels 118 including the metal interconnects 120 and the IMD layer 122.

In an alternate version of the instant example, any of the metal levels 118 and corresponding lower via levels 124 may be formed concurrently by a dual damascene process. In a dual damascene process, the ILD layer 128 is formed and the corresponding IMD layer 122 is formed over the ILD layer 128. Interconnect trenches are formed through the IMD layer 122 and via holes are formed through the ILD layer 128, by a sequence of pattern and etch steps, which may be, for example a trench-first sequence, a via-first sequence, or a partial via-first sequence. A liner, seed layer and electroplated copper fill metal are formed over the IMD layer 122, concurrently filling the via holes and the interconnect trenches. A subsequent copper CMP process removes the copper and liner from the top surface of the IMD layer 122, leaving the metal interconnects 120 in the interconnect trenches and the vias 126 in the via holes.

In another version of the instant example, any of the metal levels 118 may be formed by a masked plating process. An adhesion layer of titanium and a seed layer of copper are formed on a top surface of the relevant ILD layer 128. The adhesion layer makes electrical contact to underlying instances of the vias 126 or contacts 116. A plating mask of photoresist is formed over the seed layer so as to expose areas for the metal interconnects 120. An electroplating operation plates copper on the seed layer in the areas exposed by the plating mask to a desired thickness. The plating mask is removed, for example by ashing or by dissolving in a solvent. The seed layer and the adhesion layer outside the plated copper are removed, for example by reactive ion etch (ME) processes, leaving the plated copper and underlying seed layer and adhesion layer to provide the metal interconnects 120.

The low voltage node 130 of the high voltage component 104 is formed in one of the lower metal levels 118, possibly the lowest metal level 118. The low voltage node 130 may be formed concurrently with the metal interconnects 120 in the metal level 118. Alternatively, the low voltage node 130 may possibly be formed separately from the metal interconnects 120. The ILD layers 128 and the IMD layers 122 above the low voltage node 130 provide the main dielectric 136 of the high voltage component 104.

Figure 2B:
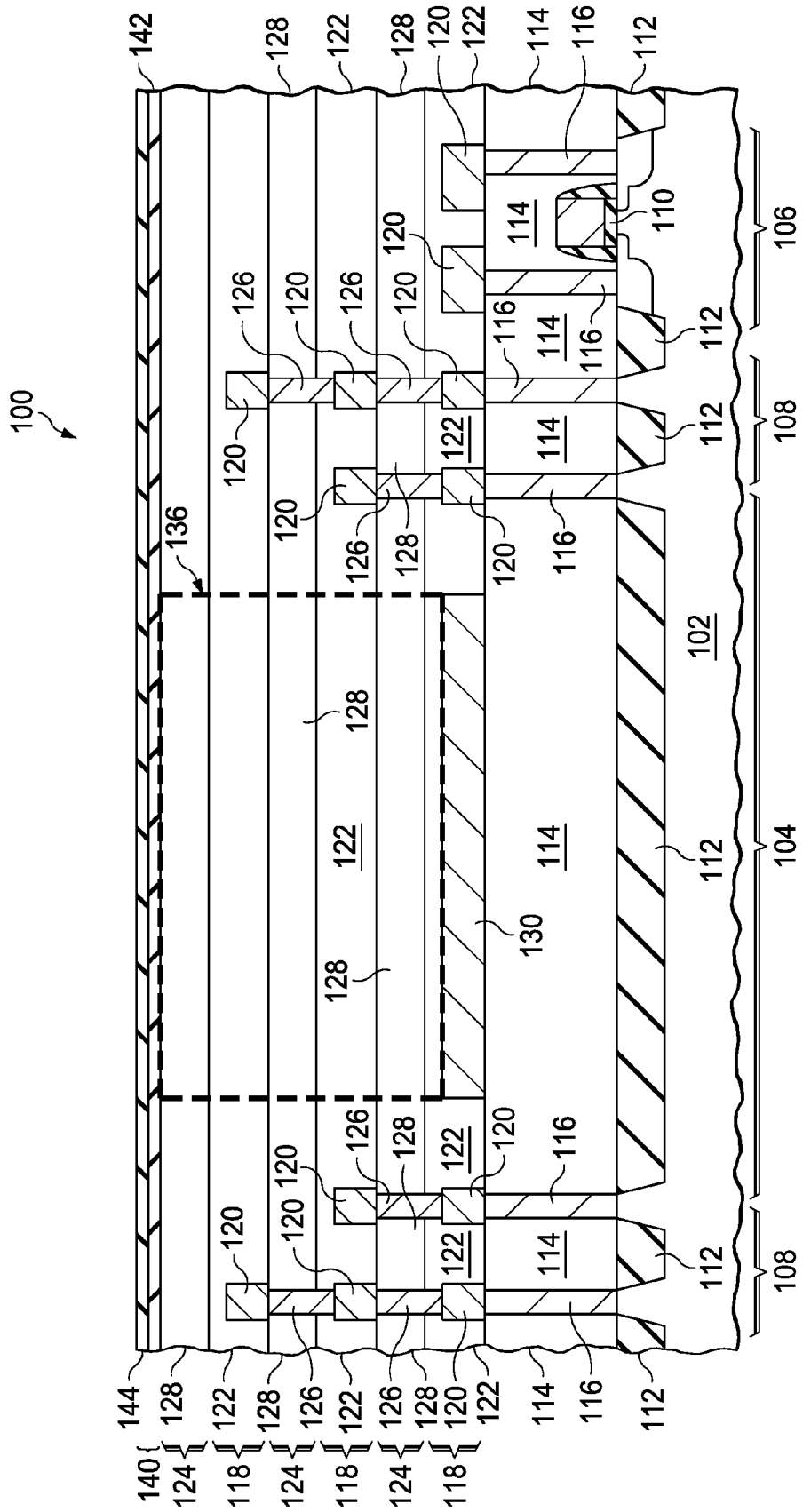

Referring to FIG. 2B, the lower-bandgap dielectric layer 140 is formed over the ILD layers 128 and the IMD layers 122 which contain the main dielectric 136 of the high voltage component 104. In the instant example, formation of the lower-bandgap dielectric layer 140 proceeds by forming the first sub-layer 142 of silicon oxide nitride, 200 nanometers to 600 nanometers thick, by a PECVD reaction using bis (tertiary-butylamino) silane (BTBAS) and TEOS. Atomic fractions of nitrogen and oxygen in the first sub-layer 142 may be selected by adjusting relative gas flows of the BTBAS and TEOS, respectively. Formation of the lower-bandgap dielectric layer 140 continues by forming the second sub-layer 144 of silicon nitride, 200 nanometers to 600 nanometers thick, by a PECVD reaction using BTBAS. In other versions of the instant example, the lower-bandgap dielectric layer 140 may consist of only one sub-layer with a bandgap energy less than the bandgap energy of the main dielectric 136. In further versions, the lower-bandgap dielectric layer 140 may have more than two sub-layers. Dielectric materials which may be used for sub-layers of the lower-bandgap dielectric layer 140 may include the dielectric materials of Table 1.

TABLE 1

| Dielectric Material | Bandgap Range (electron volts) |
| --- | --- |
| silicon oxide nitride | ~7.5 |
| silicon nitride | 4.7 to ~6 |
| silicon oxide carbide nitride | higher than silicon carbide nitride |
| silicon carbide nitride | 3.8 to 4.7 |
| tantalum pentoxide | 3.8 to 5.3 |
| diamondlike carbon | 5.5 |
| titanium dioxide | 3.3 |
| aluminum nitride | 6.2 |
| aluminum oxide | 6.5 to 7.0 |
| silicon monoxide | lower than SiO2 |
| zinc oxide | 3.4 |

Bandgaps of variable stoichiometry materials in Table 1 such as silicon oxide nitride, silicon oxide carbide nitride and silicon carbide nitride may vary, depending on a relative atomic fraction of oxygen, nitrogen and/or carbon. Versions of silicon-containing dielectric materials which are silicon rich may provide poor performance as sub-layers of the lower-bandgap dielectric layer 140 due to less-than-desired electrical impedance.

Figure 2C:
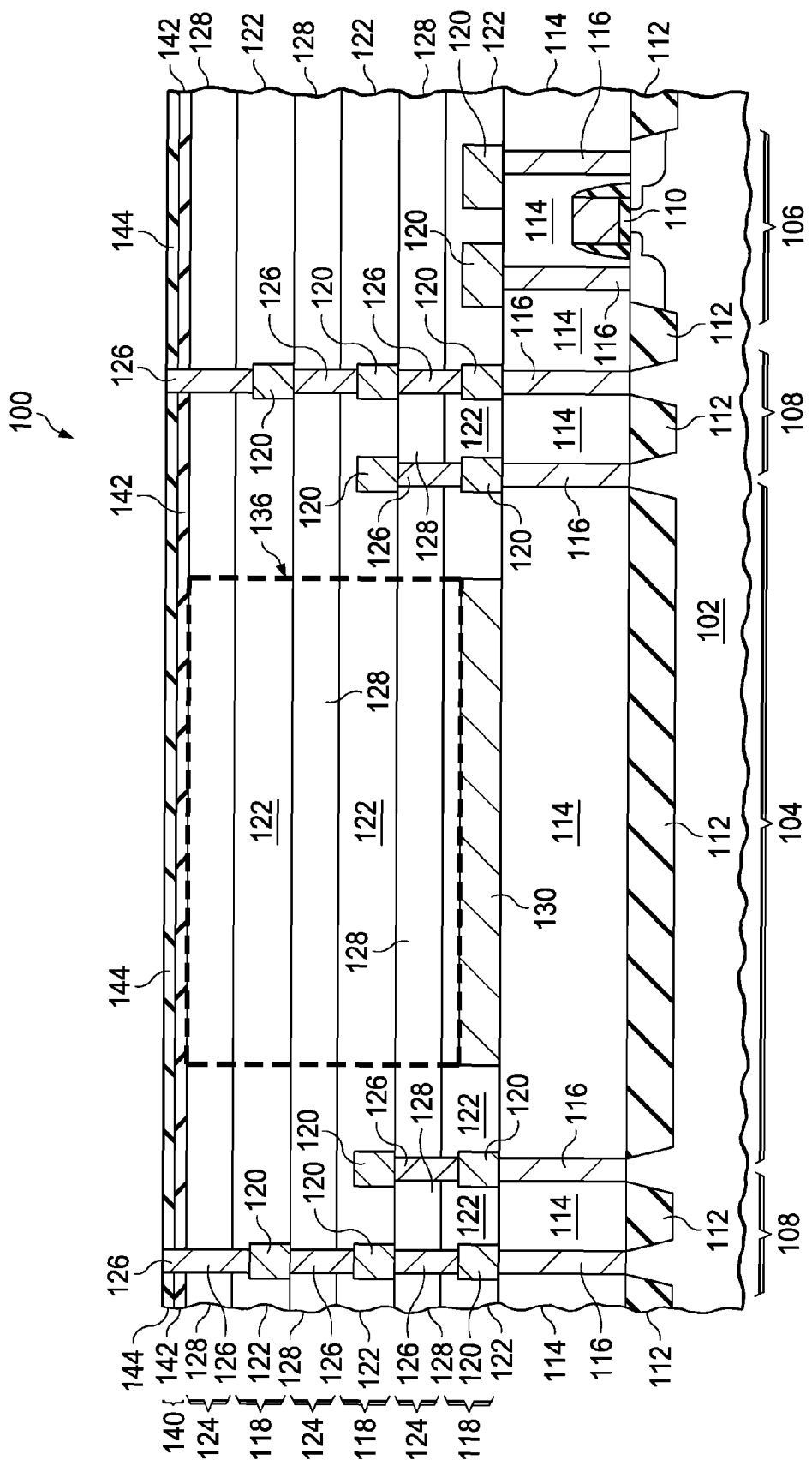

Referring to FIG. 2C, the vias 126 through the lower-bandgap dielectric layer 140 are formed after the lower-bandgap dielectric layer 140 is formed. The vias 126 through the lower-bandgap dielectric layer 140 may be formed by any of the methods described in reference to FIG. 2A.

Figure 2D:
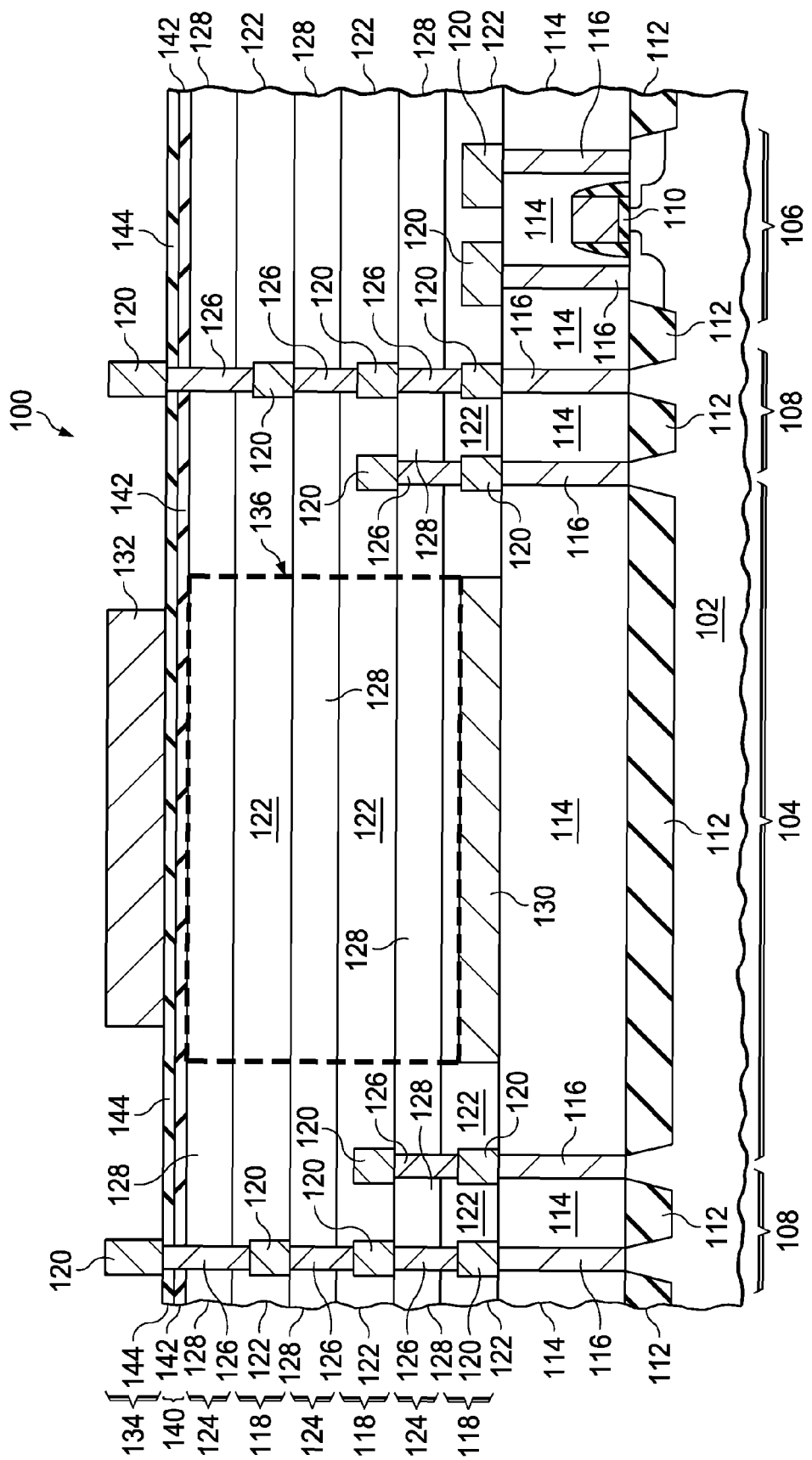

Referring to FIG. 2D, the metal interconnects 120 above the lower-bandgap dielectric layer 140 and the high voltage node 132 are formed. The metal interconnects 120 above the lower-bandgap dielectric layer 140 may be formed using any of the methods described in reference to FIG. 2A. The high voltage node 132 may be formed concurrently with the metal interconnects 120 above the lower-bandgap dielectric layer 140, or may be formed separately.

Figure 2E:
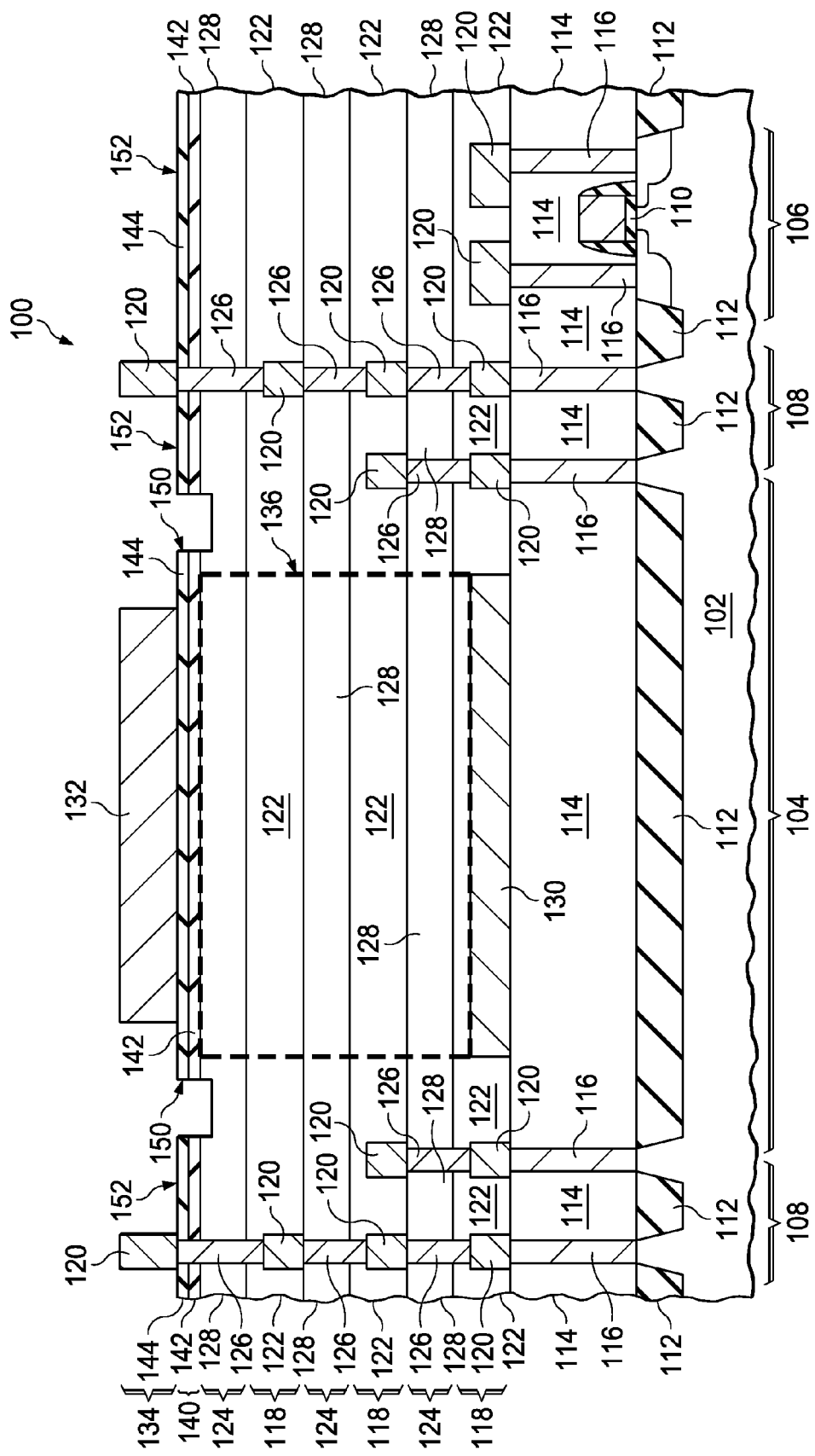

Referring to FIG. 2E, the isolation break 150 is formed through the lower-bandgap dielectric layer 140. The isolation break 150 may be formed by forming an isolation etch mask over the lower-bandgap dielectric layer 140 and etching through the lower-bandgap dielectric layer 140 into the underlying ILD layer 128, leaving the lower-bandgap dielectric layer 140 under the high voltage node 132 and the low voltage portion 152 of the lower-bandgap dielectric layer 140. Other methods of forming the isolation break 150 are discussed below.

Figure 2F:
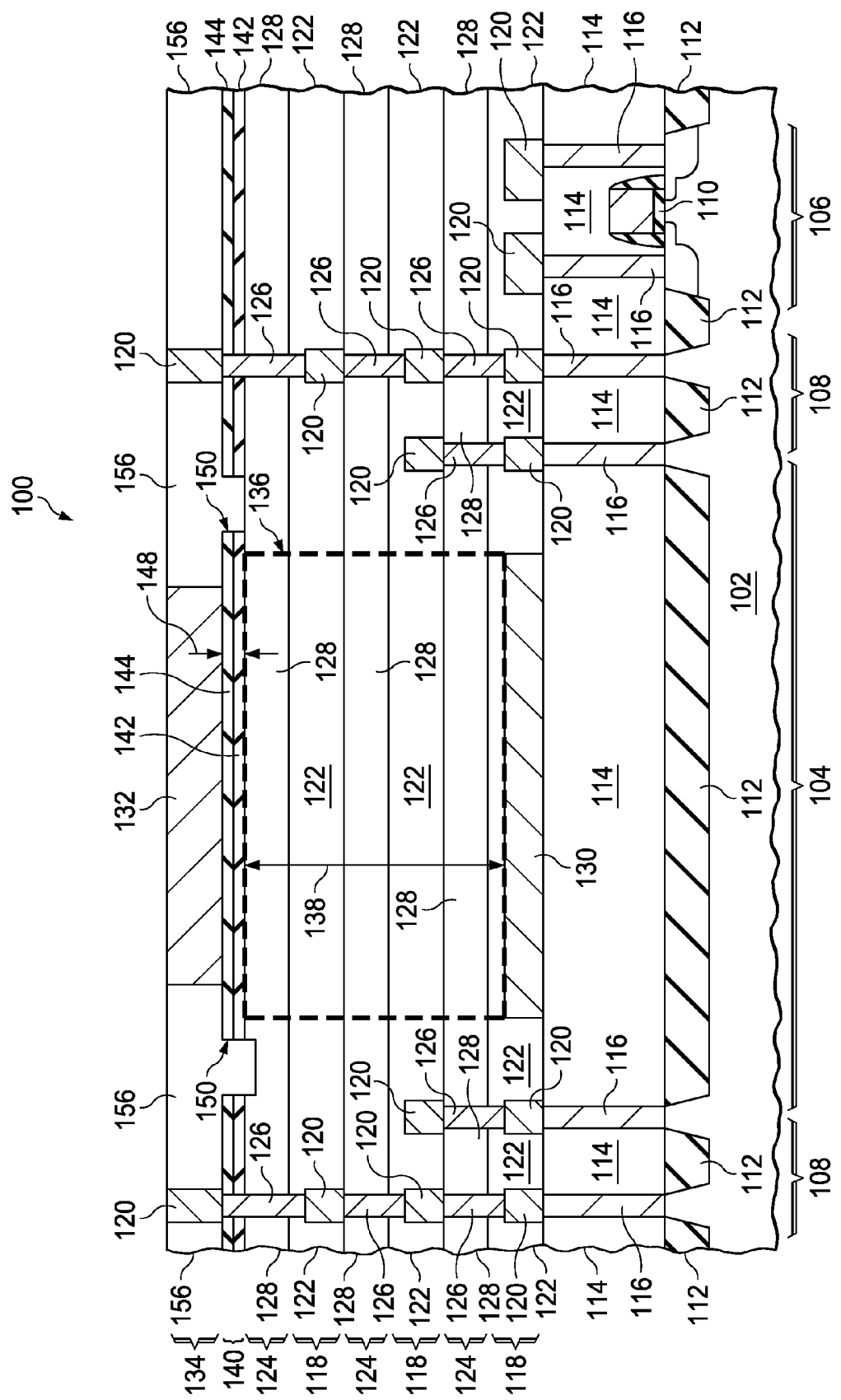

Referring to FIG. 2F, the IMD layer 122 above the lower-bandgap dielectric layer 140 is formed, abutting the isolation break 150. The IMD layer 122 above the lower-bandgap dielectric layer 140 may be formed by any of the methods described in reference to FIG. 2a. Forming the IMD layer 122 to abut the isolation break 150 advantageously prevents leakage current through an interface of the lower-bandgap dielectric layer 140 from the high voltage node 132 to a low voltage element of the microelectronic device 100. Formation of the microelectronic device 100 continues with formation of the protective overcoat 160 to subsequently provide the structure of FIG. 1.

Figure 3A:
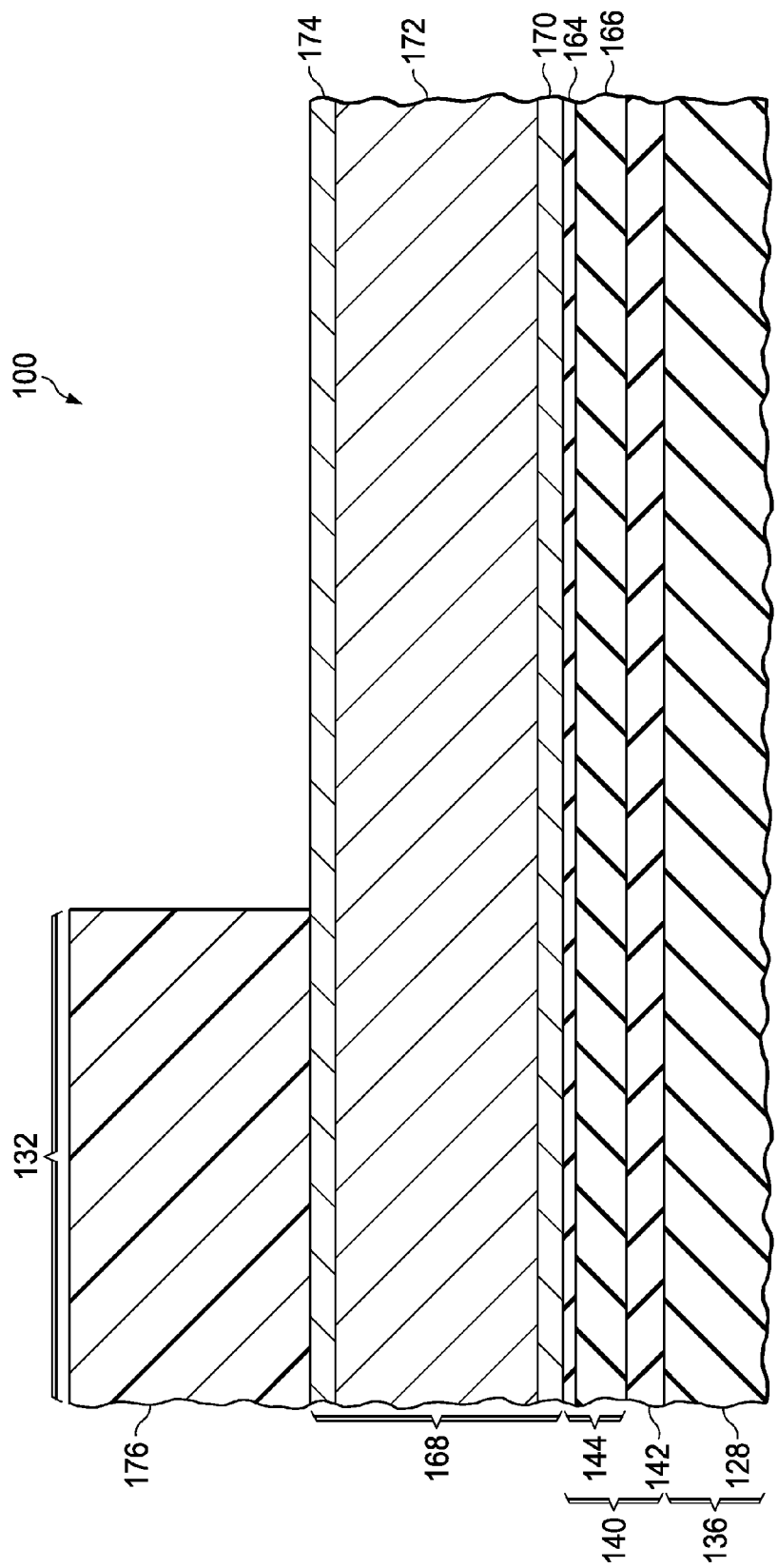
FIG. 3A through FIG. 3D are cross sections of the microelectronic device of FIG. 1 at the isolation break, depicting an alternate method of forming the isolation break and high voltage node.

FIG. 3A through FIG. 3D are cross sections of the microelectronic device of FIG. 1 at the isolation break, depicting an alternate method of forming the isolation break and high voltage node. Referring to FIG. 3A, the microelectronic device 100 is fabricated as described in reference to FIG. 2A through FIG. 2C. The lower-bandgap dielectric layer 140 is formed over the ILD layer 128 at a top of the main dielectric 136. In the instant example, the lower-bandgap dielectric layer 140 includes the first sub-layer 142 formed on the ILD layer 128 and the second sub-layer 144 formed on the first sub-layer 142. After formation of the second sub-layer 144, an oxidizing process, for example an ash process, forms an oxygen-rich top region 164 at a top of the second sub-layer 144. The oxygen-rich top region 164 may be less than 30 nanometers thick. A lower region 166 of the second sub-layer 144 is substantially unchanged by the oxidizing process.

A layer of interconnect metal 168 is formed on the lower-bandgap dielectric layer 140. The layer of interconnect metal 168 includes an adhesion layer 170 of titanium, titanium tungsten or titanium nitride, 2 nanometers to 15 nanometers thick, formed by a sputter process or a reactive sputter process. The layer of interconnect metal 168 further includes an aluminum layer 172 formed on the adhesion layer 170. The aluminum layer 172 may include a few percent of silicon, titanium and/or copper. The aluminum layer 172 may be 200 nanometers to several microns thick, formed by a sputter process. The layer of interconnect metal 168 also includes an anti-reflection layer 174 of titanium nitride, 10 nanometers to 20 nanometers thick, formed by a reactive sputter process on the aluminum layer 172. Other configurations for the layer of interconnect metal 168 are within the scope of the instant example.

An interconnect mask 176 is formed over the layer of interconnect metal 168 so as to cover areas for the metal interconnects 120 of FIG. 1 above the lower-bandgap dielectric layer 140 and the high voltage node 132. The interconnect mask 176 may include photoresist formed by a photolithographic process, and may also include an anti-reflection layer and/or a hard mask layer. FIG. 3A depicts a portion of the interconnect mask 176 over an edge of the subsequently-formed high voltage node 132.

Figure 3B:
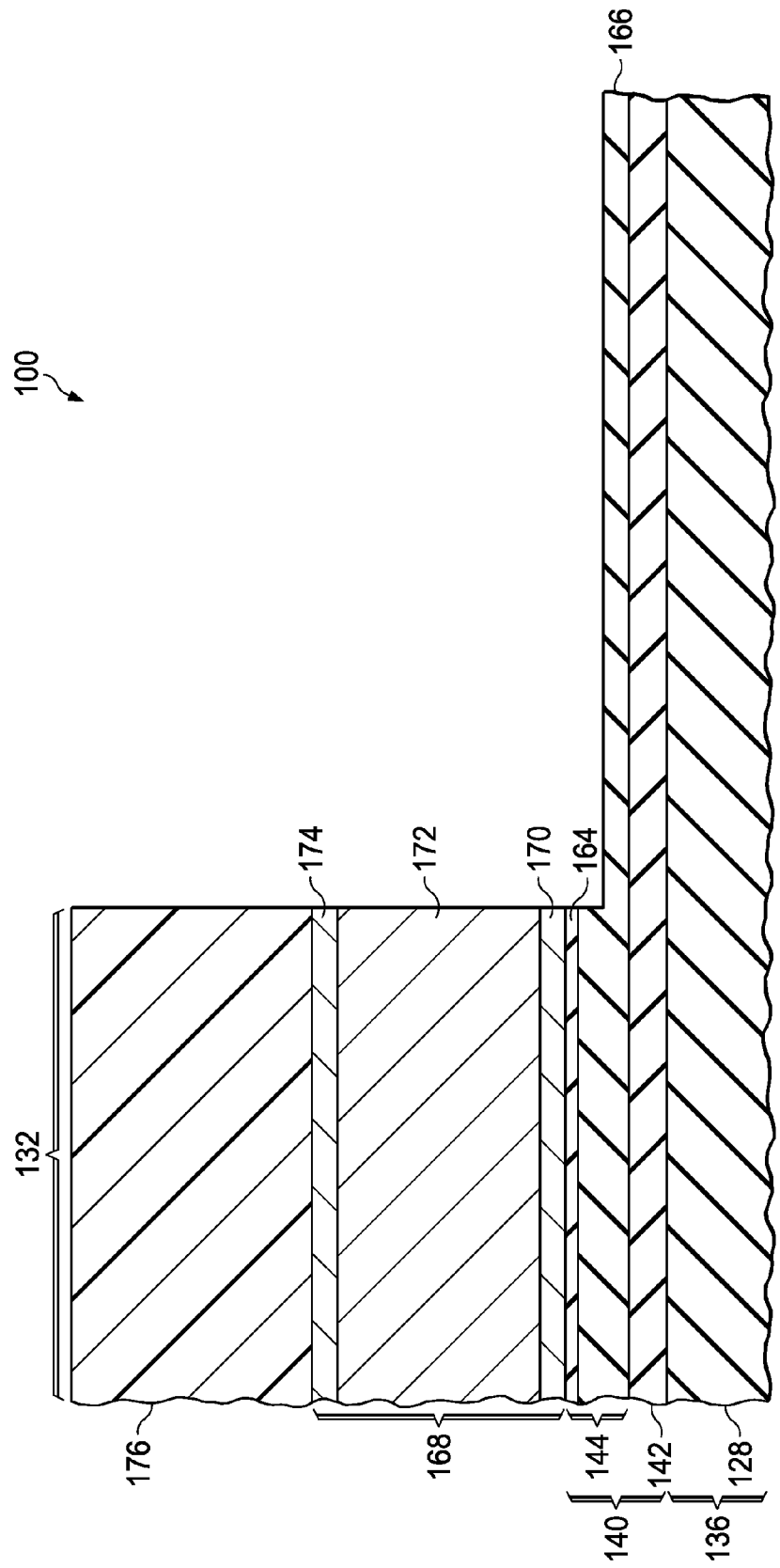

Referring to FIG. 3B, an interconnect etch process removes the layer of interconnect metal 168 in areas exposed by the interconnect mask 176, leaving the high voltage node 132 and the metal interconnects 120 of FIG. 1 above the lower-bandgap dielectric layer 140. In the instant example, the interconnect etch process further removes a portion, but not all, of the second sub-layer 144 of the lower-bandgap dielectric layer 140 in the areas exposed by the interconnect mask 176. The interconnect mask 176 is subsequently removed, for example by an ash process. At least 10 nanometers of the second sub-layer 144 remains in the areas exposed by the interconnect mask 176 after the interconnect etch process is completed and the interconnect mask 176 is removed.

Figure 3C:
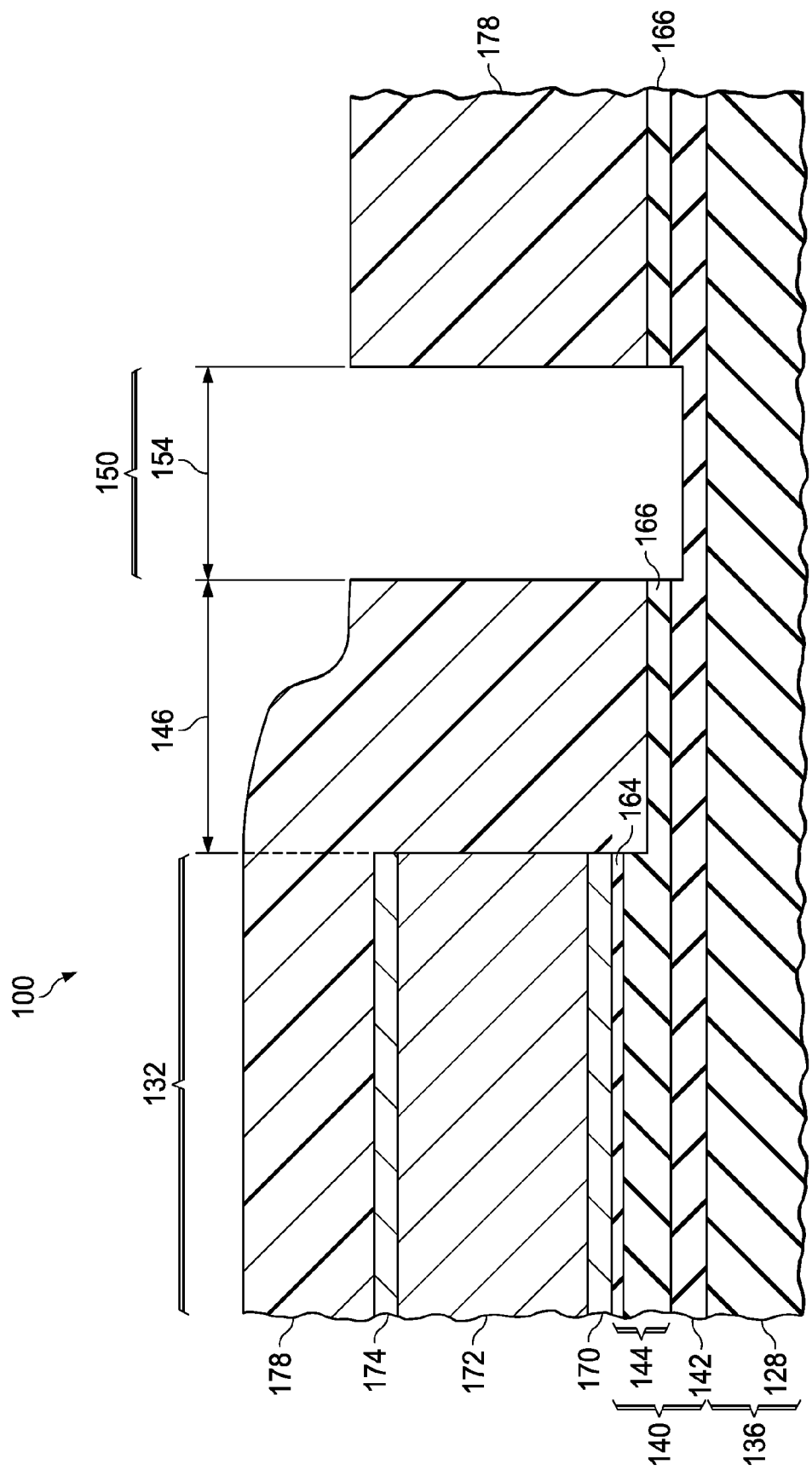

Referring to FIG. 3C, a first isolation etch mask 178 is formed over the high voltage node 132 and the lower-bandgap dielectric layer 140 so as to expose an area for the isolation break 150. The first isolation etch mask 178 may include photoresist formed by a photolithographic process. The area for the isolation break 150 is laterally separated from the high voltage node 132 by the distance 146 as described in reference to FIG. 1. The width 154 of the area for the isolation break 150 is described in reference to FIG. 1. The width 154 may be 10 microns to 25 microns to advantageously facilitate the photolithographic process for formation of the first isolation etch mask 178 with a desired level of process margin. A first isolation etch process removes the second sub-layer 144 in the area exposed by the first isolation etch mask 178. In the instant example, the first isolation etch process may remove a portion, but not all, of the first sub-layer 142 in the area for the isolation break 150. The first isolation etch mask 178 is subsequently removed, for example by an ash process.

Figure 3D:
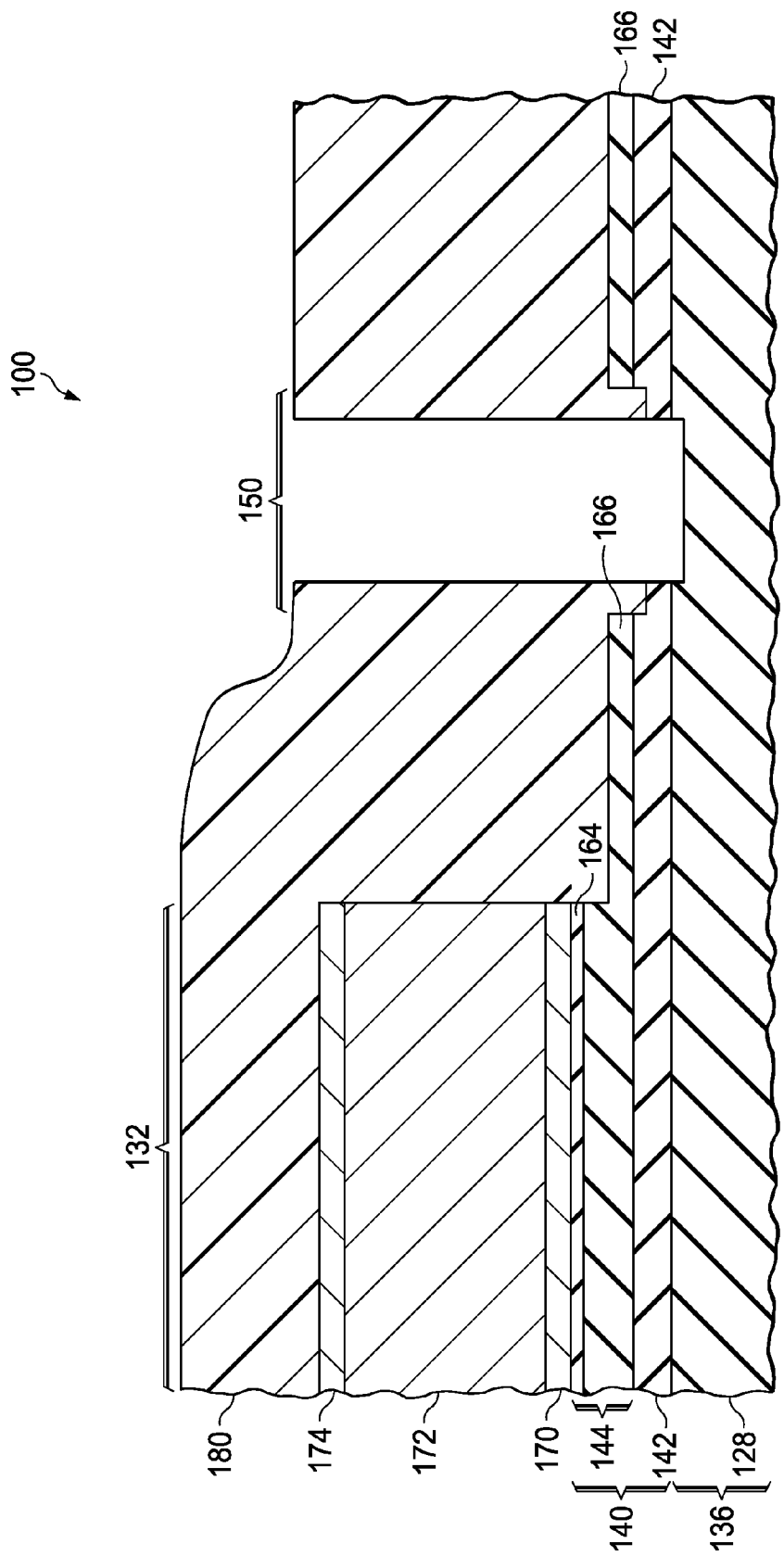

Referring to FIG. 3D, a second isolation mask 180 is formed over the high voltage node 132 and the lower-bandgap dielectric layer 140 so as to expose an area inside the area for the isolation break 150. The second isolation mask 180 may be formed similarly to the first isolation etch mask 178 of FIG. 3C. A second isolation etch process removes the first sub-layer 142 in the area exposed by the second isolation mask 180. The second isolation etch process may remove a portion of the ILD layer 128 at the top of the main dielectric 136, as depicted in FIG. 3D. Forming the isolation break 150 in two etch steps as described in the instant example may advantageously provide more reliable prevention of leakage current through an interface of the lower-bandgap dielectric layer 140 from the high voltage node 132 to a low voltage element of the microelectronic device 100.

Figure 4A:
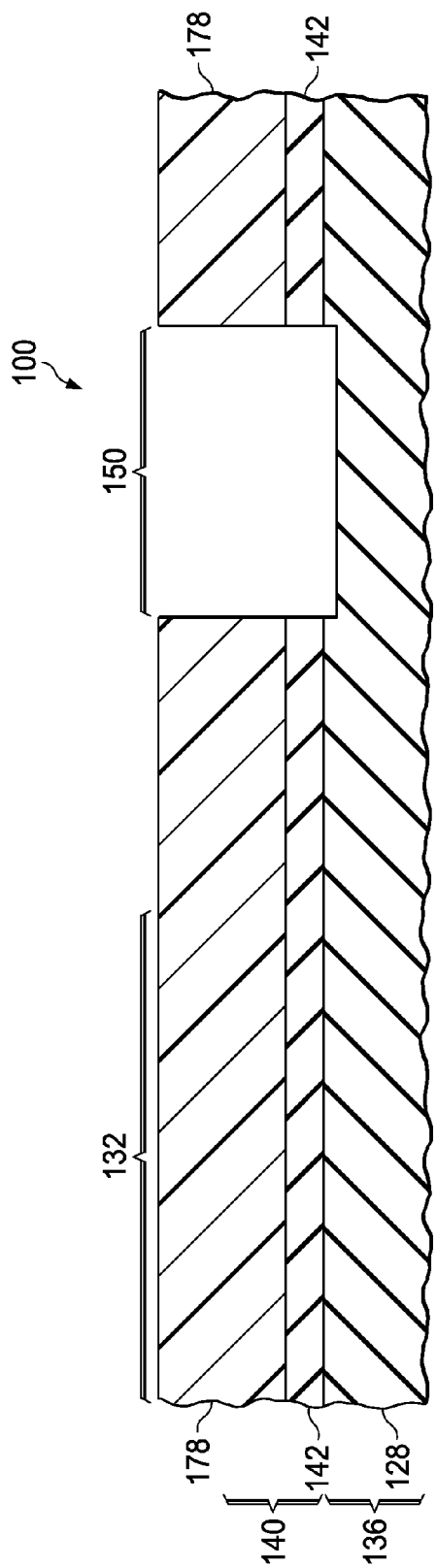
FIG. 4A through FIG. 4E are cross sections of the microelectronic device of FIG. 1 at the isolation break, depicting another alternate method of forming the isolation break and high voltage node.

FIG. 4A through FIG. 4E are cross sections of the microelectronic device of FIG. 1 at the isolation break, depicting another alternate method of forming the isolation break and high voltage node. Referring to FIG. 4A, the microelectronic device 100 is fabricated as described in reference to FIG. 2A. The first sub-layer 142 of the lower-bandgap dielectric layer 140 is formed over the ILD layer 128 at a top of the main dielectric 136. In the instant example, the lower-bandgap dielectric layer 140 includes the first sub-layer 142 formed on the ILD layer 128 and the second sub-layer 144 formed on the first sub-layer 142. A first isolation etch mask 178 is formed over the first sub-layer 142 so as to expose an area for the isolation break 150. The area for the isolation break 150 is laterally separated from the area for the high voltage node 132 as described in reference to FIG. 1. The width of the area for the isolation break 150 is described in reference to FIG. 1. The width may be 10 microns to 25 microns to advantageously facilitate the photolithographic process for formation of the first isolation etch mask 178 with a desired level of process margin. A first isolation etch process removes the first sub-layer 142 in the area exposed by the first isolation etch mask 178. The first isolation etch process may remove a portion of the ILD layer 128 at the top of the main dielectric 136, as depicted in FIG. 4A. The first isolation etch mask 178 is subsequently removed, for example by an ash process.

Figure 4B:
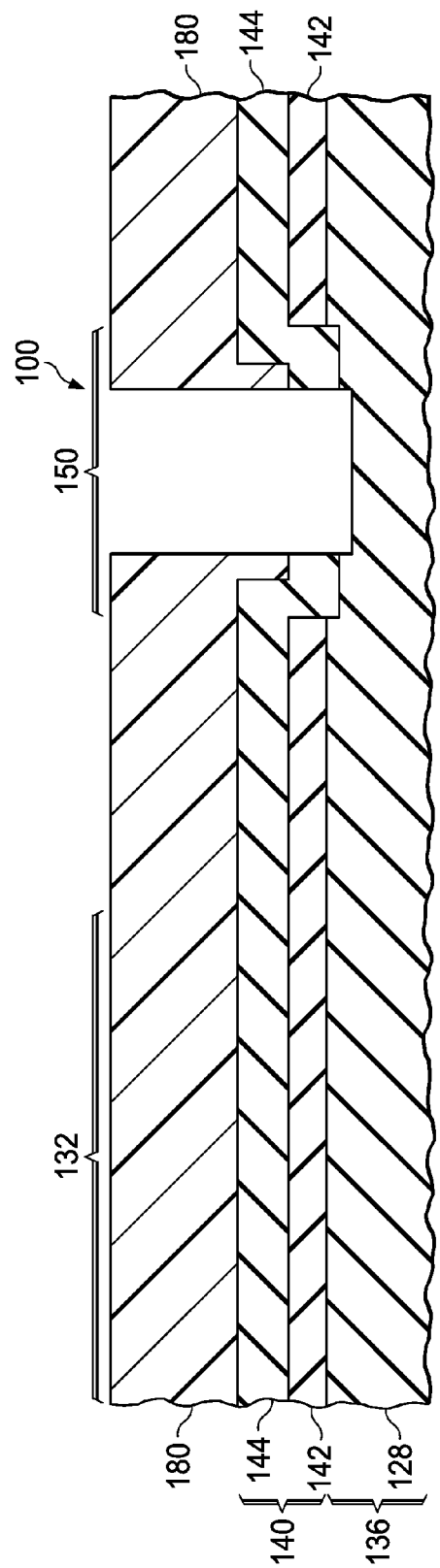

Referring to FIG. 4B, the second sub-layer 144 of the lower-bandgap dielectric layer 140 is formed on the first sub-layer 142, overlapping the first sub-layer 142 and extending onto the ILD layer 128 at the isolation break 150. A second isolation mask 180 is formed over the second sub-layer 144 so as to expose an area inside the area for the isolation break 150. A second isolation etch process removes the second sub-layer 144 in the area exposed by the second isolation mask 180. The second isolation etch process may remove another portion of the ILD layer 128 at the top of the main dielectric 136, as depicted in FIG. 4B. Overlapping the second sub-layer 144 over the first sub-layer 142 at the isolation break 150 as described in the instant example may advantageously provide more reliable prevention of leakage current through an interface of the lower-bandgap dielectric layer 140.

Figure 4C:
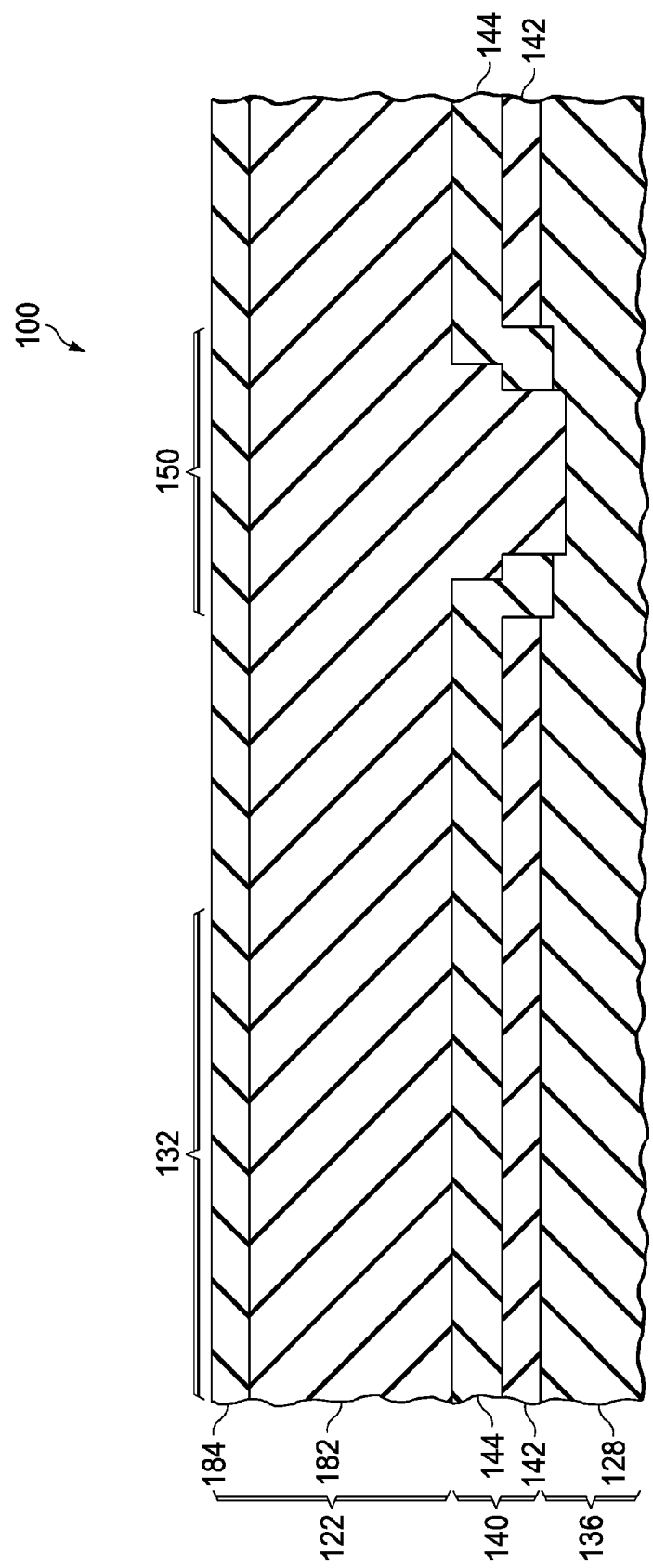

Referring to FIG. 4C, the IMD layer 122 above the lower-bandgap dielectric layer 140 is formed over the second sub-layer 144, extending onto the ILD layer 128 at the isolation break 150. In the instant example, the IMD layer 122 includes a main layer 182 of silicon-dioxide-based dielectric material formed over the second sub-layer 144 and a CMP stop layer 184 of silicon carbide, silicon carbide nitride and/or silicon oxide carbide nitride, 10 nanometers to 20 nanometers thick, formed on the main layer 182.

Figure 4D:
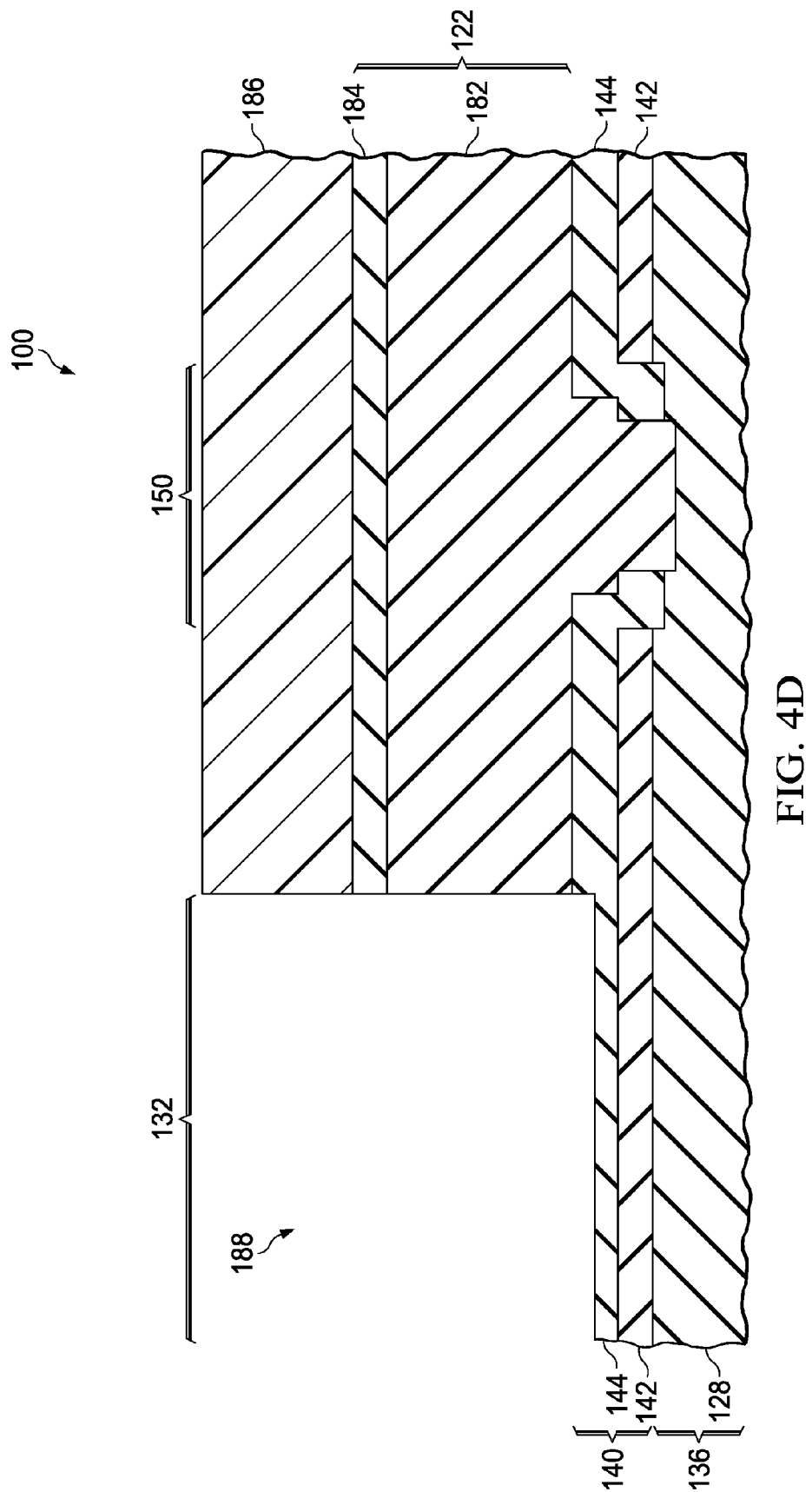

Referring to FIG. 4D, an interconnect trench mask 186 is formed over the IMD layer 122 above the lower-bandgap dielectric layer 140 so as to expose the area for the high voltage node 132. A trench etch process removes the IMD layer 122 in the area exposed by the interconnect trench mask 186 to form an interconnect trench 188, and may remove a portion, but not all, of the second sub-layer 144 of the lower-bandgap dielectric layer 140. The interconnect trench mask 186 is subsequently removed.

Figure 4E:
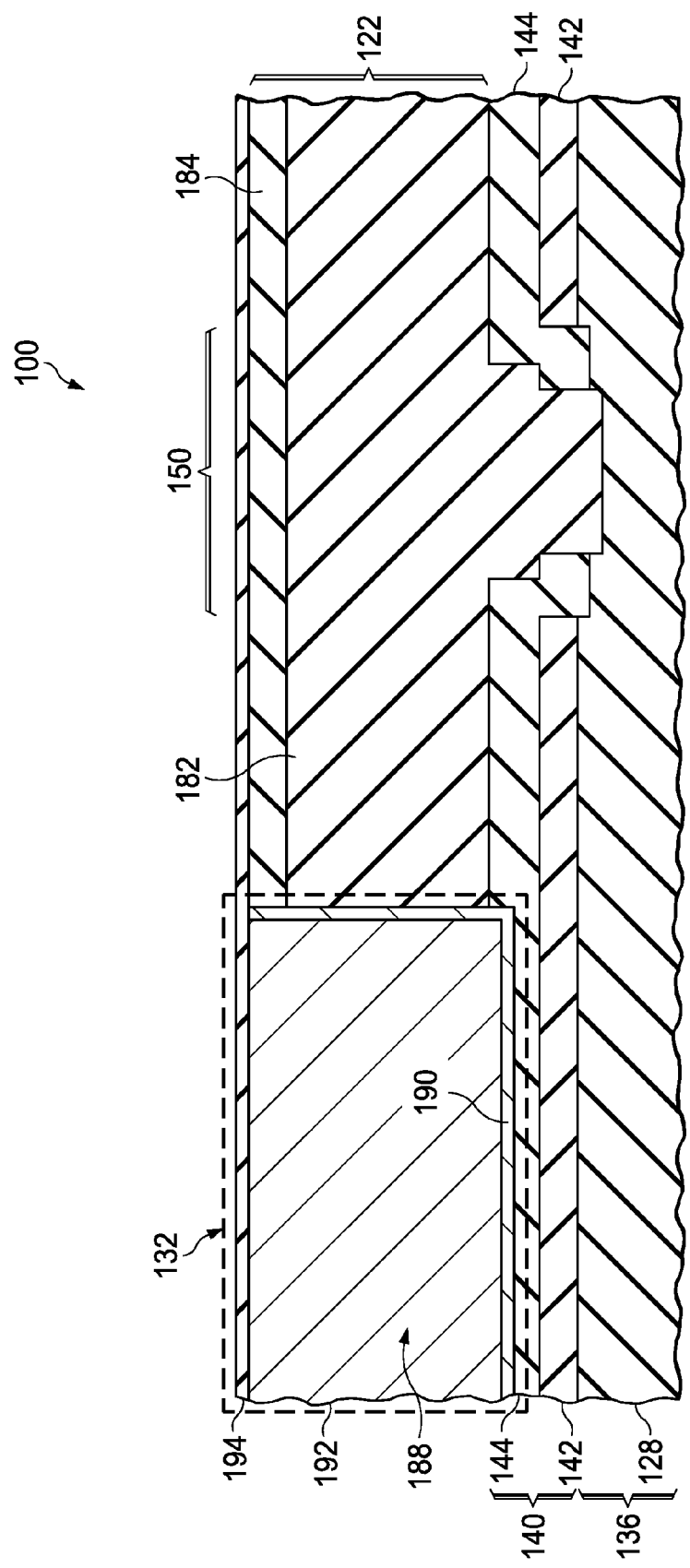

Referring to FIG. 4E, the high voltage node 132 is formed in the interconnect trench 188 by a damascene process, for example as described in reference to FIG. 2a. The high voltage node 132 of the instant example includes a liner 190 of tantalum nitride and a fill metal 192 of copper. An optional cap layer 194 of dielectric material such as silicon nitride may be formed over the high voltage node 132 and the IMD layer 122. Forming the isolation break 150 prior to forming the high voltage node 132 by a damascene process may simplify advantageously fabrication of the microelectronic device 100.

Figure 5A:
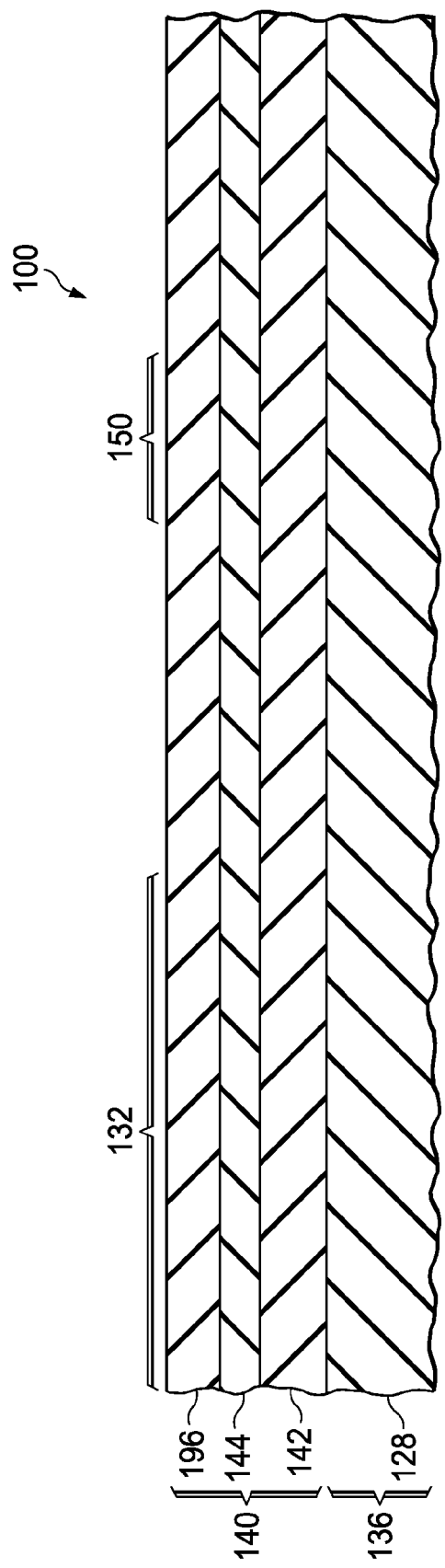
FIG. 5A through FIG. 5F are cross sections of the microelectronic device of FIG. 1 at the isolation break, depicting a further alternate method of forming the isolation break and high voltage node.

FIG. 5A through FIG. 5F are cross sections of the microelectronic device of FIG. 1 at the isolation break, depicting another method of forming the isolation break and high voltage node. Referring to FIG. 5A, the microelectronic device 100 is fabricated as described in reference to FIG. 2A through FIG. 2C. The lower-bandgap dielectric layer 140 is formed over the ILD layer 128 at a top of the main dielectric 136. In the instant example, the lower-bandgap dielectric layer 140 includes the first sub-layer 142 formed on the ILD layer 128, the second sub-layer 144 formed on the first sub-layer 142, and a third sub-layer 196 formed on the second sub-layer 144. A bandgap energy of the first sub-layer 142 may be less than a bandgap energy of the ILD layer 128 at a top of the main dielectric 136. A bandgap energy of the second sub-layer 144 may be less than the bandgap energy of the first sub-layer 142. A bandgap energy of the third sub-layer 196 may be less than the bandgap energy of the second sub-layer 144.

Figure 5B:
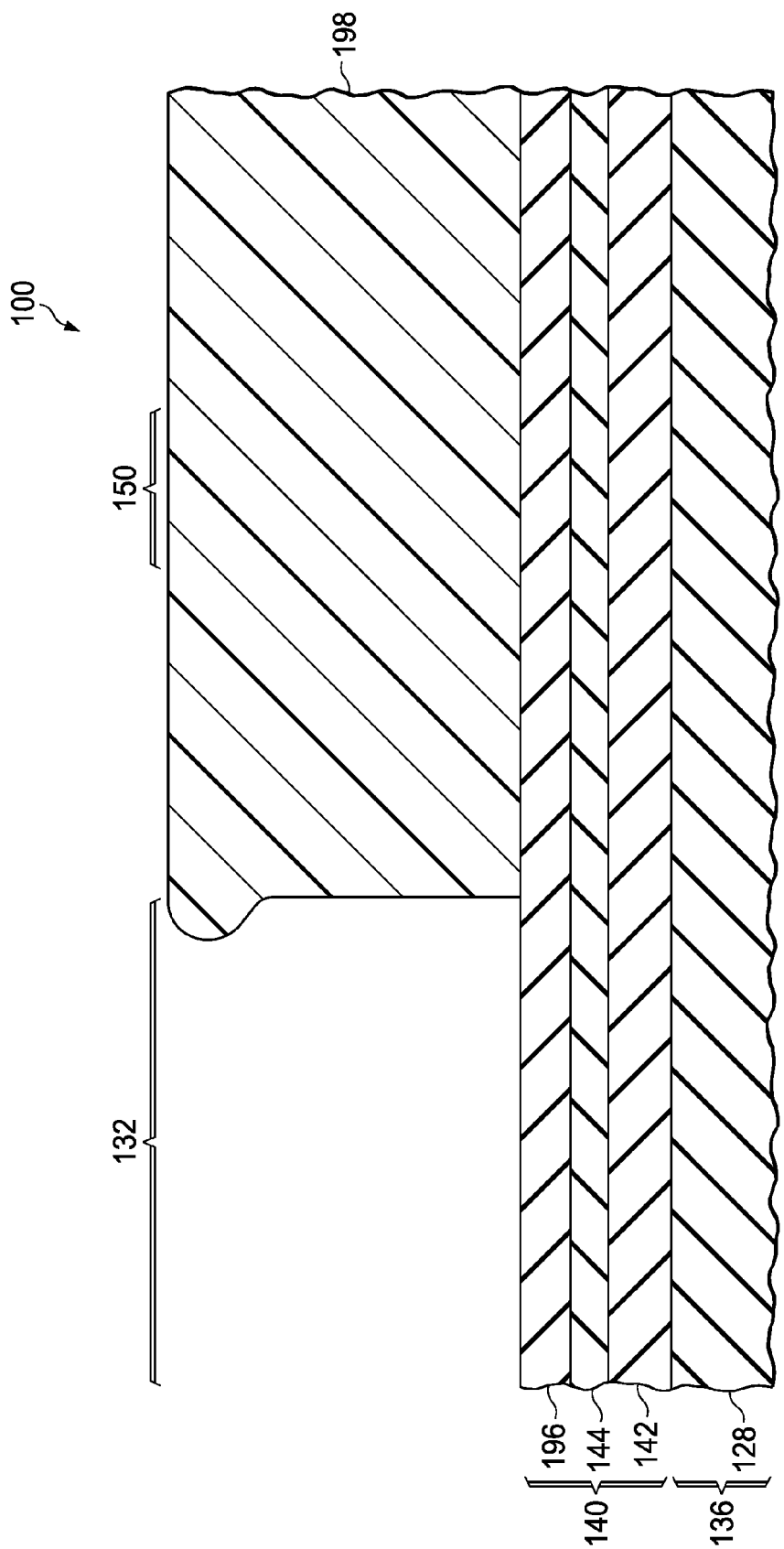

Referring to FIG. 5B, a liftoff pattern 198 is formed over the lower-bandgap dielectric layer 140 so as to expose the area for the high voltage node 132 and cover areas outside the high voltage node 132 including the area for the isolation break 150. The liftoff pattern 198 may include positive tone photoresist containing novolak resin, and may be formed by a photolithographic process. A thickness of the liftoff pattern 198 is greater than a desired thickness of the subsequently-formed high voltage node 132.

Figure 5C:
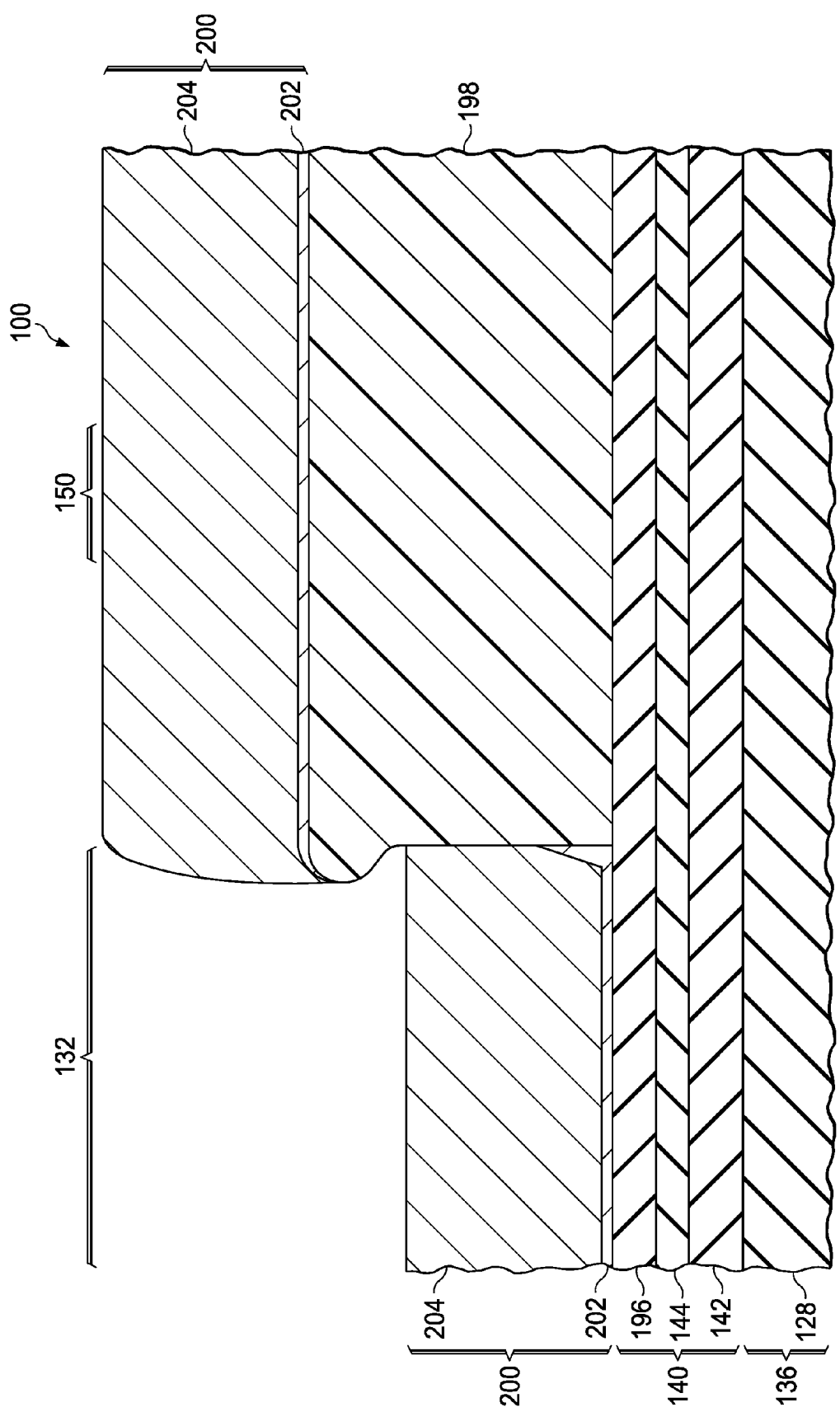

Referring to FIG. 5C, interconnect metal 200 is formed over the liftoff pattern 198 and on the lower-bandgap dielectric layer 140 in the area exposed by the liftoff pattern 198. The interconnect metal 200 includes an adhesion layer 202 of evaporated titanium and a fill metal 204 of evaporated aluminum or gold. A profile of the liftoff pattern 198 may advantageously assist formation of a discontinuity in the interconnect metal 200 at an edge of the liftoff pattern. The liftoff pattern 198 is subsequently removed, for example by a solvent spray process, which concurrently removes the interconnect metal 200 over the liftoff pattern 198 and leaves the interconnect metal 200 on the lower-bandgap dielectric layer 140 in the area exposed by the liftoff pattern 198 to form the high voltage node 132.

Figure 5D:
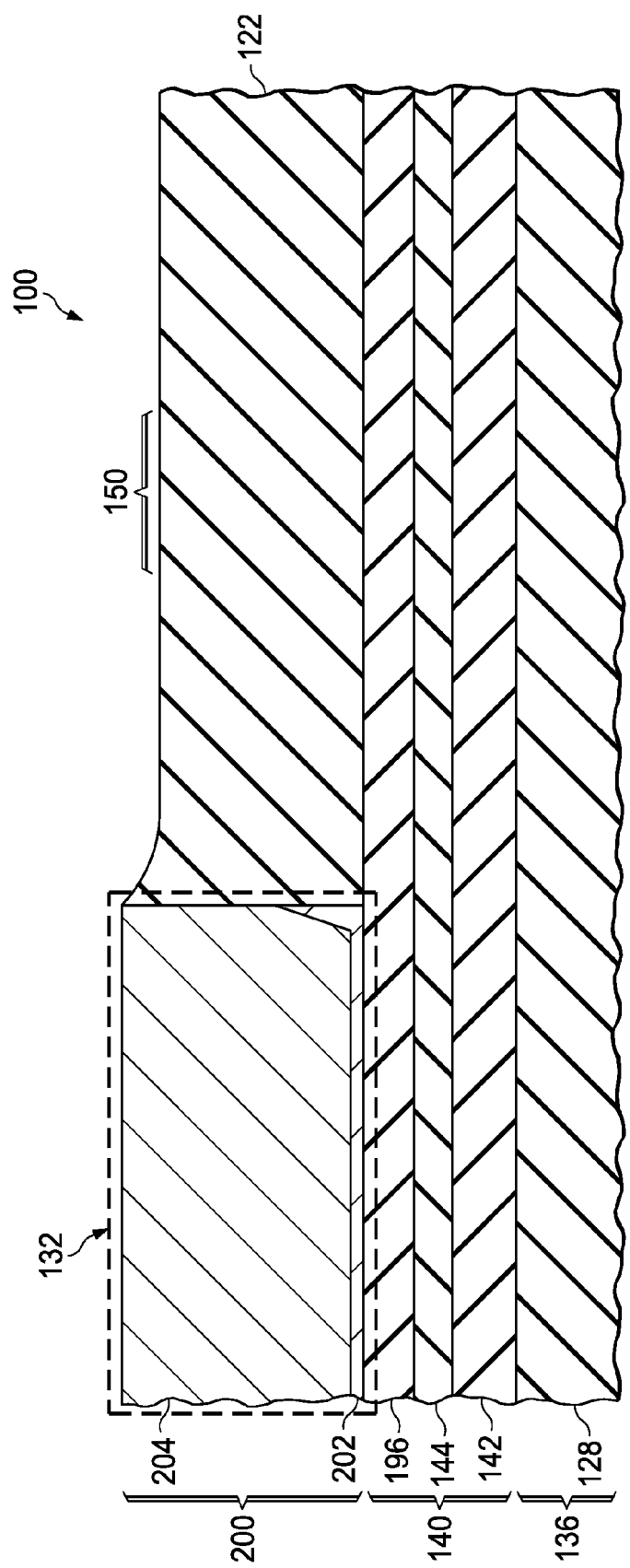

Referring to FIG. 5D, the IMD layer 122 above the lower-bandgap dielectric layer 140 is formed. The IMD layer 122 may be formed by spin coating the microelectronic device 100 with a solution containing MSQ. The solution is subsequently baked to removed volatile material, leaving the IMD layer 122 formed of a low-k silicon-dioxide based dielectric material, possibly covering the high voltage node 132. A subsequent blanket etch may recess the IMD layer 122 to expose a top surface of the high voltage node 132 as depicted in FIG. 5D.

Figure 5E:
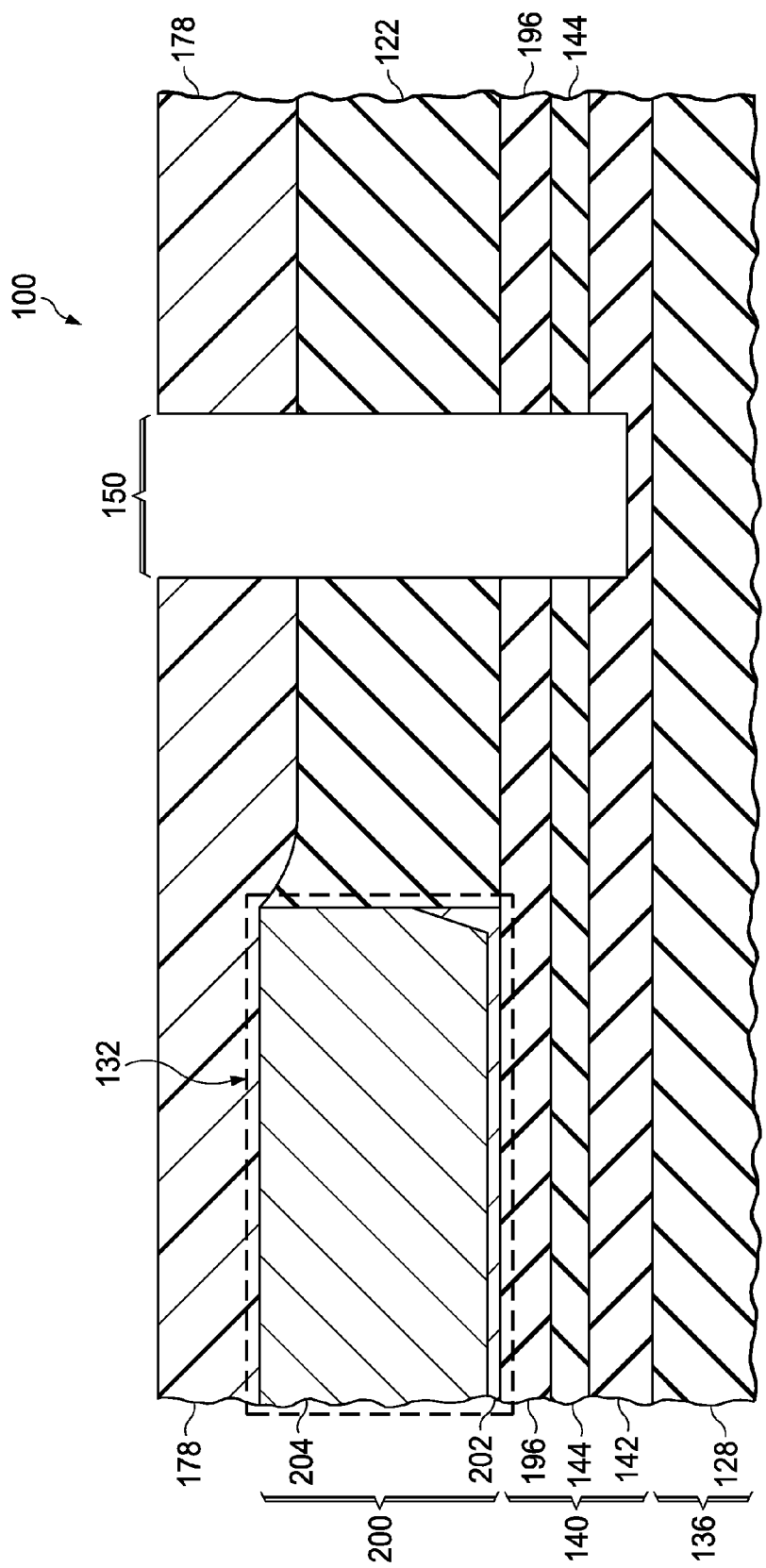

Referring to FIG. 5E, an isolation etch mask 178 is formed over the high voltage node 132 and the IMD layer 122 so as to expose an area for the isolation break 150. An isolation etch process removes the third sub-layer 196, the second sub-layer 144 and at least a portion, and possibly all, of the first sub-layer 142 in the area for the isolation break 150. The isolation etch mask 178 is subsequently removed, for example by an ash process. Forming the isolation etch mask 178 after forming the IMD layer 122 provides a more planar topology for the isolation etch mask 178 and may advantageously provide desired process margin for fabrication of the microelectronic device 100.

Figure 5F:
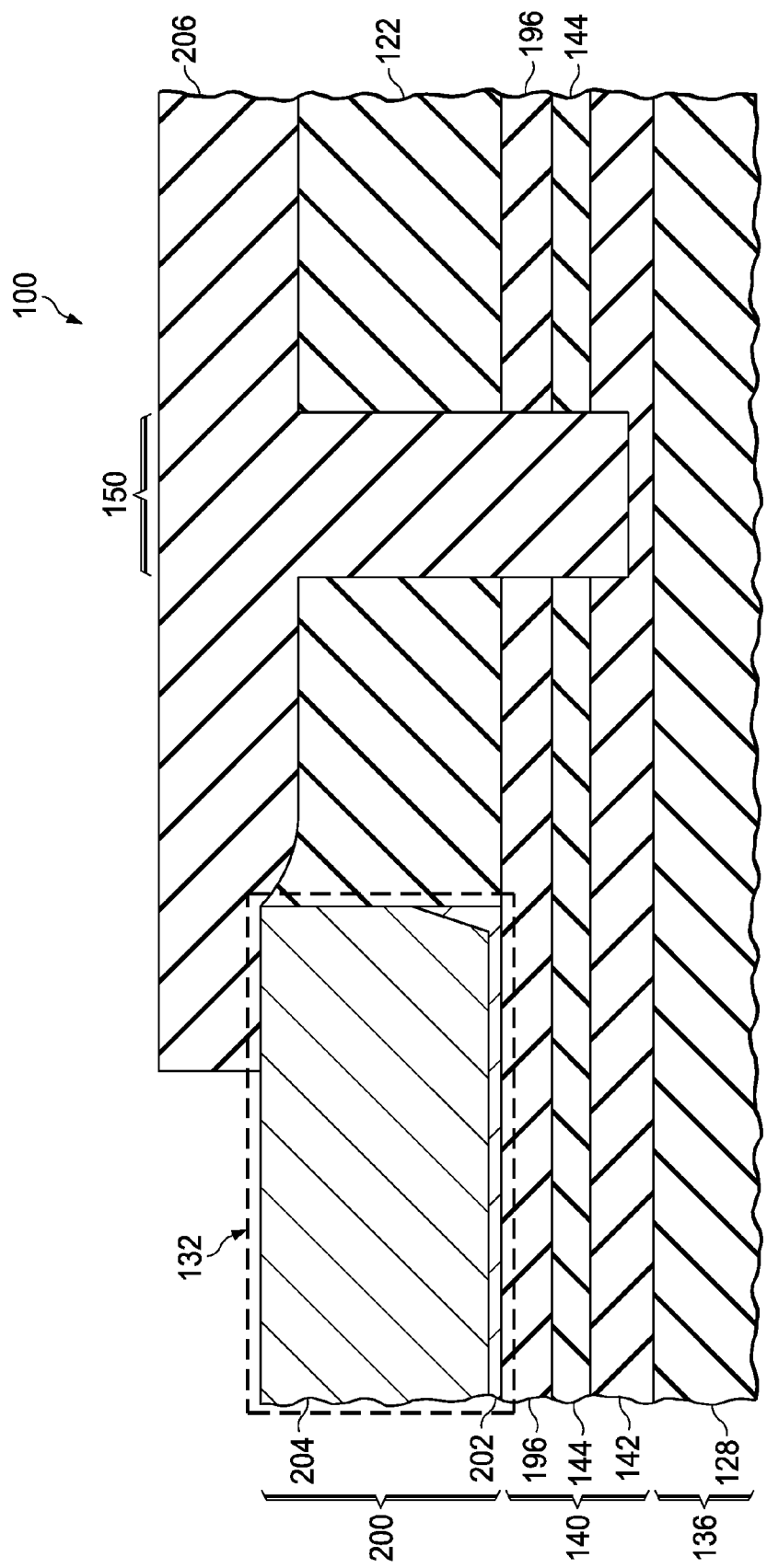

Referring to FIG. 5F, a dielectric layer 206 is formed over the IMD layer 122, extending into the cavity formed by the isolation etch process and contacting the lower-bandgap dielectric layer 140 at the isolation break 150. The dielectric layer 206 may be, for example, the protective overcoat 160 of FIG. 1. The dielectric layer 206 advantageously provides reliability by preventing leakage current through the lower-bandgap dielectric layer 140 at the isolation break 150.

Figure 6A:
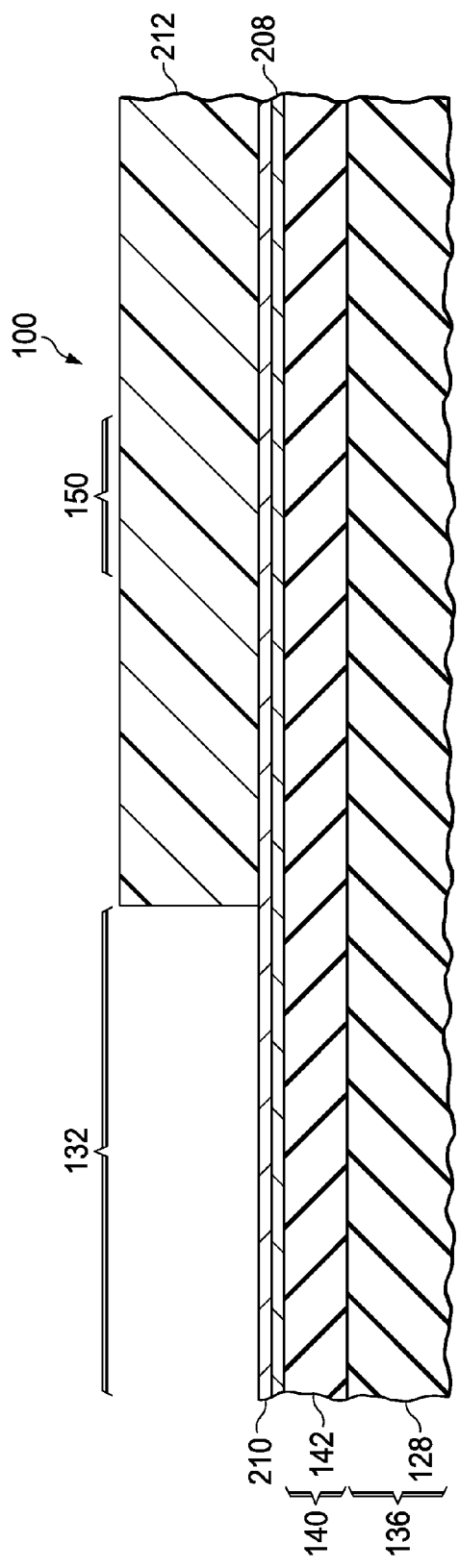

FIG. 6A through FIG. 6G are cross sections of the microelectronic device of FIG. 1 at the isolation break, depicting a further alternate method of forming the isolation break and high voltage node. Referring to FIG. 6A, the microelectronic device 100 is fabricated as described in reference to FIG. 2A through FIG. 2C. The lower-bandgap dielectric layer 140 is formed over the ILD layer 128 at a top of the main dielectric 136. In the instant example, the lower-bandgap dielectric layer 140 includes the first sub-layer 142 formed on the ILD layer 128. A bandgap energy of the first sub-layer 142 is less than a bandgap energy of the ILD layer 128 at a top of the main dielectric 136. Other configurations of the lower-bandgap dielectric layer 140 including additional sub-layers are within the scope of the instant example.

An adhesion layer 208 is formed over the lower-bandgap dielectric layer 140. The adhesion layer 208 may include 5 nanometers to 20 nanometers of titanium, chromium, titanium nitride, tantalum, tantalum nitride and/or nickel, formed by a sputter process. A seed layer 210 is formed on the adhesion layer 208. The seed layer 210 may include 20 nanometers to 100 nanometers of copper, nickel and/or chromium, formed by a sputter process. In an alternate version of the instant example, the adhesion layer 208 and the seed layer 210 may be combined in a single homogeneous layer of metal such as chromium.

A plating mask 212 is formed over the seed layer 210 so as to expose the area for the high voltage node 132 and cover areas outside the high voltage node 132 including the area for the isolation break 150. The plating mask 212 may include photoresist, and may be formed by a photolithographic process. A thickness of the plating mask 212 is greater than a desired thickness of the subsequently-formed high voltage node 132.

Figure 6B:
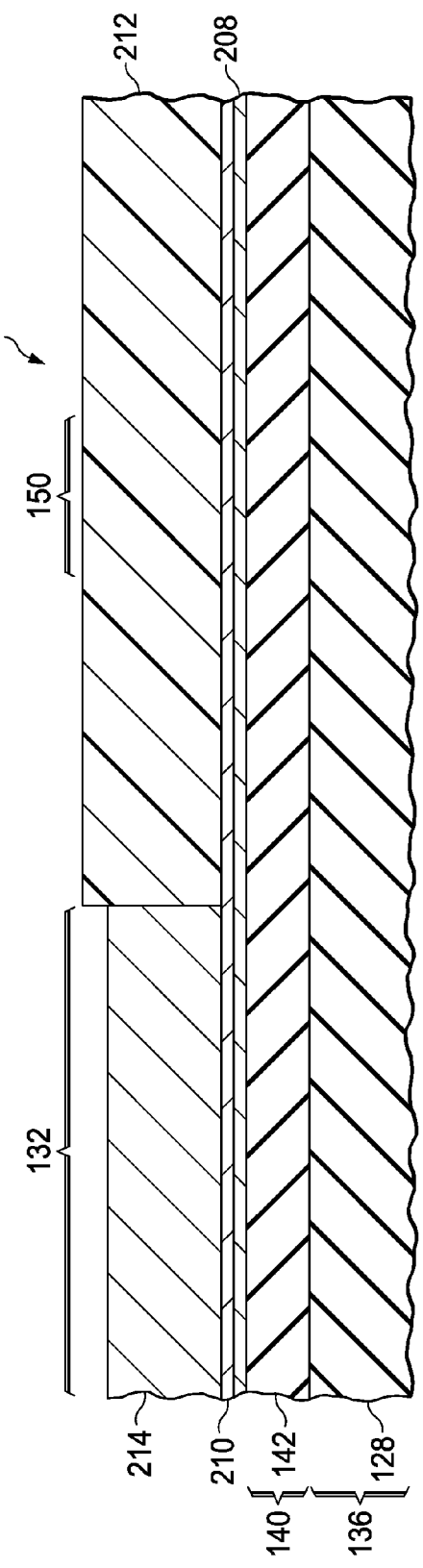

Referring to FIG. 6B, an electroplating process forms a layer of plated metal 214 on the seed layer 210 in the area for the high voltage node 132 exposed by the plating mask 212. The layer of plated metal 214 may include primarily copper, or may include a thick base of copper and a cap layer of nickel, palladium and gold. The layer of plated metal 214 may advantageously be formed to a thickness of several microns.

Referring to FIG. 6C, the plating mask 212 of FIG. 6B is removed, leaving substantially all of the layer of plated metal 214 in place. The plating mask 212 may be removed, for example, by ashing or by dissolving in a solvent.

Referring to FIG. 6D, the seed layer 210 and the adhesion layer 208 are removed outside the area for the high voltage node 132, leaving the layer of plated metal 214 combined with the seed layer 210 and the adhesion layer 208 under the layer of plated metal 214 to provide the high voltage node 132. The seed layer 210 and the adhesion layer 208 may be removed by reactive ion etch processes. The process of removing the seed layer 210 and the adhesion layer 208 may possibly remove a portion, but not all, of the lower-bandgap dielectric layer 140, as depicted in FIG. 6D.

Figure 6E:
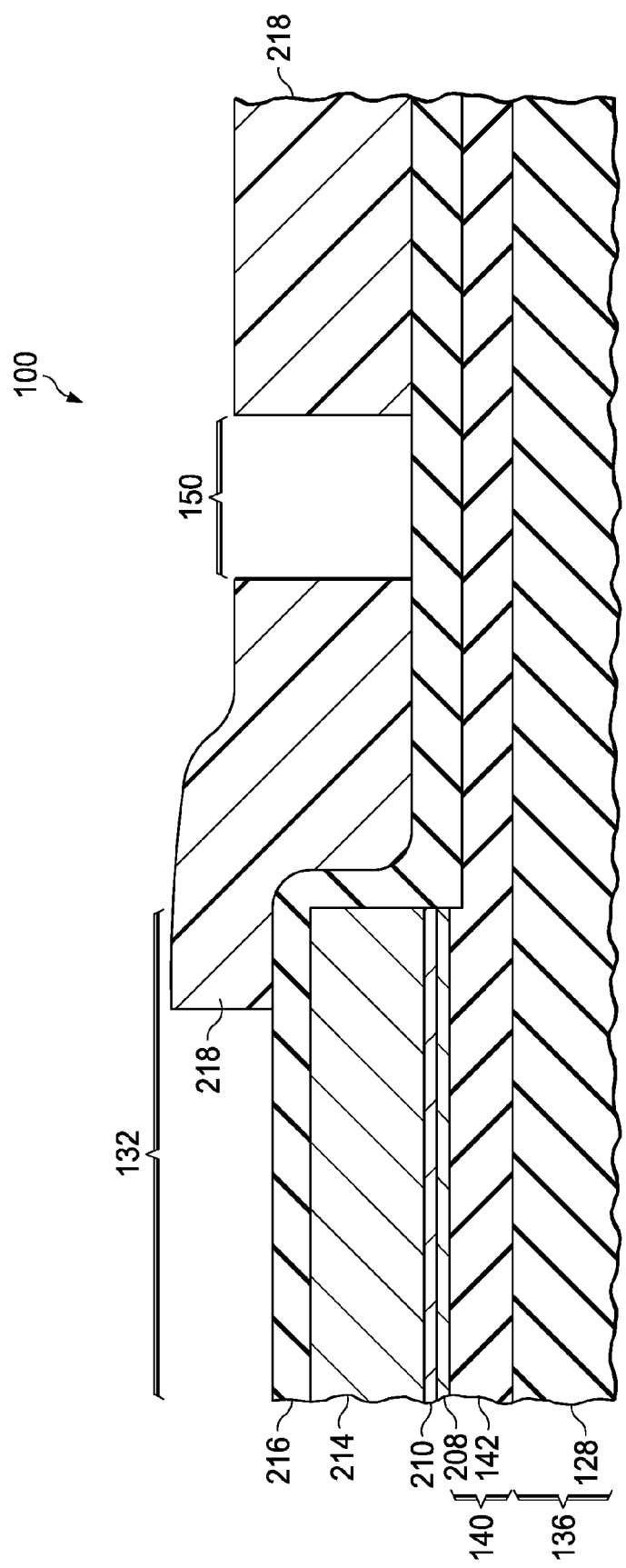

Referring to FIG. 6E, a layer of protective overcoat 216 is formed over the high voltage node 132 and the lower-bandgap dielectric layer 140. The layer of protective overcoat 216 may include one or more layers of silicon dioxide, silicon nitride, silicon oxynitride, and/or polyimide, 500 nanometers to 5 microns thick. In the instant example, the layer of protective overcoat 216 covers the area for the isolation break 150. A protective overcoat mask 218 is formed over the layer of protective overcoat 216 so as to expose the area for the isolation break 150 and a portion of the area for the high voltage node 132. The protective overcoat mask 218 may include photoresist formed by a photolithographic process.

Referring to FIG. 6F, an etch process removes the layer of protective overcoat 216 in the areas exposed by the protective overcoat mask 218, including the area for the isolation break 150 and the portion of the area for the high voltage node 132. The high voltage node 132 is exposed in the portion of the area by the etch process. The etch process is continued so as to remove the lower-bandgap dielectric layer 140 in the area exposed by the protective overcoat mask 218, forming the isolation break 150. The etch process may possibly be performed in two steps wherein a first step remove the layer of protective overcoat 216 and a second step removes the lower-bandgap dielectric layer 140 without unacceptably degrading the high voltage node 132. The etch process may include one or more RIE operations.

Referring to FIG. 6G, the protective overcoat mask 218 of FIG. 6F is removed. The protective overcoat mask 218 may be removed by an ash process followed by a wet clean. In the instant example, the isolation break 150 may possibly be left exposed until the microelectronic device 100 is encapsulated or otherwise sealed during a subsequent packaging/assembly process. Alternatively, a second layer of protective overcoat may be formed over an existing top surface of the microelectronic device 100, sealing the isolation break 150.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An integrated circuit, comprising:
   a substrate;
   a lower conductive plate positioned above the substrate;
   a first dielectric layer positioned above the lower conductive plate, the first dielectric layer having a first bandgap energy;
   a second dielectric layer positioned on the first dielectric layer, the second dielectric layer having a second bandgap energy lower than the first bandgap energy;
   an isolation break separating the second dielectric layer into:
      a first portion co-extending with the lower conductive plate; and
      a second portion free of overlapping with the lower conductive plate; and
   an upper conductive plate positioned above the second dielectric layer and circumscribed by the isolation break.

2. The integrated circuit of claim 1, wherein the second dielectric layer includes:
   a first sub-layer positioned on the first dielectric layer, the first sub-layer having the first bandgap energy;
   a second sub-layer positioned on the first sub-layer, the second sub-layer having a third bandgap energy lower than the second bandgap energy.

3. The integrated circuit of claim 1, wherein the second dielectric layer includes a silicon nitride layer.

4. The integrated circuit of claim 1, wherein the second dielectric layer includes a silicon oxynitride layer.

5. The integrated circuit of claim 1, wherein the second dielectric layer includes:
   a silicon oxynitride layer positioned on the first dielectric layer;
   a silicon nitride layer positioned on the silicon oxynitride layer.

6. The integrated circuit of claim 1, wherein the first portion of the second dielectric layer extends beyond the lower conductive plate.

7. The integrated circuit of claim 1, wherein the first dielectric layer has a thickness of at least 2 microns.

8. The integrated circuit of claim 1, wherein the upper conductive plate is smaller than the lower conductive plate.

9. The integrated circuit of claim 1, wherein the upper conductive plate sized with equal area as the lower conductive plate.

10. The integrated circuit of claim 1, further comprising:
    a circuit positioned under the second portion of the second dielectric layer, the circuit coupled to an interconnect layer for receiving a first voltage; and
    a bond pad on the upper conductive plate for receiving a second voltage substantially higher than the first voltage.

11. An integrated circuit, comprising:
    a substrate;
    a lower conductive plate positioned above the substrate;
    a first dielectric layer positioned above the lower conductive plate, the first dielectric layer having a first bandgap energy;
    a second dielectric layer positioned on the first dielectric layer, the second dielectric layer having a second bandgap energy lower than the first bandgap energy, the second dielectric layer divided into:
       a first portion co-extending with the lower conductive plate; and
       a second portion free of overlapping with the lower conductive plate and spaced apart from the first portion; and
    an upper conductive plate positioned above and within a perimeter of the first portion of the second dielectric layer.

12. The integrated circuit of claim 11, wherein the first portion of the second dielectric layer extends beyond the lower conductive plate.

13. The integrated circuit of claim 11, wherein the first portion of the second dielectric layer has a thickness and extends beyond the lower conductive plate by at least a distance twice of the thickness.

14. The integrated circuit of claim 11, wherein the second dielectric layer includes:
    a first sub-layer positioned on the first dielectric layer, the first sub-layer having the first bandgap energy;
    a second sub-layer positioned on the first sub-layer, the second sub-layer having a third bandgap energy lower than the second bandgap energy.

15. The integrated circuit of claim 11, wherein the second dielectric layer includes a silicon nitride layer.

16. The integrated circuit of claim 11, wherein the second dielectric layer includes a silicon oxynitride layer.

17. The integrated circuit of claim 11, wherein the second dielectric layer includes:
    a silicon oxynitride layer positioned on the first dielectric layer;
    a silicon nitride layer positioned on the silicon oxynitride layer.

18. The integrated circuit of claim 11, wherein the first dielectric layer has a thickness of at least 2 microns.

19. The integrated circuit of claim 11, further comprising:
    a circuit positioned under the second portion of the second dielectric layer, the circuit coupled to an interconnect layer for receiving a first voltage; and
    a bond pad on the upper conductive plate for receiving a second voltage substantially higher than the first voltage.

20. The integrated circuit of claim 11, further comprising:
an isolation break laterally surrounding the first portion of the second dielectric layer and isolating the first portion of the second dielectric layer from the second portion of the second dielectric layer, the isolation break having a third bandgap energy higher than the second bandgap energy.

* * * * *